United States Patent
Sana et al.

(10) Patent No.: US 12,061,146 B2
(45) Date of Patent: Aug. 13, 2024

(54) ELECTRICITY MEASURING TYPE SURFACE PLASMON RESONANCE SENSOR, ELECTRICITY MEASURING TYPE SURFACE PLASMON RESONANCE SENSOR CHIP, METHOD FOR DETECTING SURFACE PLASMON RESONANCE CHANGES

(71) Applicant: AISIN CORPORATION, Kariya (JP)

(72) Inventors: Amrita Sana, Sapporo (JP); Giles Allison, Sapporo (JP); Hironori Suzuki, Sapporo (JP); Hidemi Kato, Sapporo (JP); Masao Ando, Sapporo (JP); Viet Cuong Le, Sapporo (JP)

(73) Assignee: AISIN CORPORATION, Kariya (JP)

( * ) Notice: Subject to any disclaimer, the term of this patent is extended or adjusted under 35 U.S.C. 154(b) by 524 days.

(21) Appl. No.: 17/267,287

(22) PCT Filed: Oct. 16, 2020

(86) PCT No.: PCT/JP2020/039026
§ 371 (c)(1),
(2) Date: Feb. 9, 2021

(87) PCT Pub. No.: WO2021/075529
PCT Pub. Date: Apr. 22, 2021

(65) Prior Publication Data
US 2021/0396663 A1    Dec. 23, 2021

(30) Foreign Application Priority Data
Oct. 18, 2019  (JP) .................................. 2019-191210

(51) Int. Cl.
*G01N 21/552* (2014.01)
*H01L 31/0232* (2014.01)
(Continued)

(52) U.S. Cl.
CPC ....... *G01N 21/553* (2013.01); *H01L 31/0232* (2013.01); *H01L 31/108* (2013.01); *G01N 2021/434* (2013.01)

(58) Field of Classification Search
CPC ............ G01N 21/553; G01N 2021/434; H01L 31/0232; H01L 31/108
See application file for complete search history.

(56) References Cited

U.S. PATENT DOCUMENTS

| | | | |
|---|---|---|---|
| 5,155,617 A | 10/1992 | Solgaard et al. | |
| 5,591,407 A * | 1/1997 | Groger | G01N 21/39 422/82.11 |

(Continued)

FOREIGN PATENT DOCUMENTS

| | | | | |
|---|---|---|---|---|
| CN | 101802592 B | * | 1/2013 | ........... G01N 21/553 |
| CN | 102042972 B | * | 1/2013 | |

(Continued)

OTHER PUBLICATIONS

"Light-Emitting Diodes: A Primer," Russ Dahl, Phontonics Marketplace (Year: 2023).*

(Continued)

*Primary Examiner* — Dominic J Bologna
*Assistant Examiner* — Chad Andrew Reverman
(74) *Attorney, Agent, or Firm* — Oliff PLC

(57) ABSTRACT

An electricity measuring type surface plasmon resonance sensor includes: a plasmon resonance intensifying sensor chip in which a prism and a sensor chip including an electrode, a silicon semiconductor film, and a plasmon resonance film electrode arranged in this order are arranged in an order of the prism, the electrode, the silicon semiconductor film, and the plasmon resonance film electrode; and (Continued)

an electric measuring apparatus which directly measures a current or voltage from the electrode and the plasmon resonance film electrode.

11 Claims, 13 Drawing Sheets

(51) Int. Cl.
*H01L 31/108* (2006.01)
*G01N 21/43* (2006.01)

(56) References Cited

U.S. PATENT DOCUMENTS

| | | | |
|---|---|---|---|
| 5,633,492 A | 5/1997 | Nikitin et al. | |
| 5,685,919 A | 11/1997 | Saito et al. | |
| 10,983,052 B2 * | 4/2021 | Suzuki | H01L 31/108 |
| 2010/0328671 A1 * | 12/2010 | Baldo | G01N 21/553 |
| | | | 257/E31.124 |
| 2011/0114859 A1 | 5/2011 | Amako et al. | |
| 2011/0116088 A1 | 5/2011 | Amako et al. | |
| 2013/0229652 A1 | 9/2013 | Amako et al. | |
| 2014/0318596 A1 * | 10/2014 | Juluri | H01L 31/022483 |
| | | | 136/255 |
| 2018/0045668 A1 * | 2/2018 | Paik | G01N 33/5438 |
| 2019/0056389 A1 * | 2/2019 | Dana | G01N 33/54373 |
| 2020/0182789 A1 * | 6/2020 | Suzuki | G01N 21/41 |
| 2021/0190772 A1 * | 6/2021 | Mendes | G01N 21/7703 |

FOREIGN PATENT DOCUMENTS

| | | | | |
|---|---|---|---|---|
| CN | 103502798 A | * | 1/2014 | ........... C12Q 1/6837 |
| CN | 112014358 A | * | 12/2020 | |
| JP | H08-264821 A | | 10/1996 | |
| JP | 2000-356587 A | | 12/2000 | |
| JP | 2001194295 A | * | 7/2001 | ............ G01N 21/05 |
| JP | 4076962 B2 | * | 4/2008 | ........... G01N 21/553 |
| JP | 2011-141265 A | | 7/2011 | |
| JP | 2012-38541 A | | 2/2012 | |
| JP | 2018-189523 A | | 11/2018 | |
| JP | 2020134133 A | * | 8/2020 | |
| JP | 7172693 B2 | * | 11/2022 | |
| WO | 2008/075542 A1 | | 6/2008 | |
| WO | WO-2009070665 A1 | * | 6/2009 | ............ B82Y 10/00 |
| WO | 2019/031591 A1 | | 2/2019 | |
| WO | WO-2019031591 A1 | * | 2/2019 | ............ G01N 21/41 |
| WO | WO-2021075529 A1 | * | 4/2021 | ........... G01N 21/553 |

OTHER PUBLICATIONS

"Doped Silicon Nanocrystal Plasmonics," Hui Zhang et al., American Chemical Society, Mar. 28, 2017 (Year: 2017).*
"Light-Emitting Diodes: A Primer," Russ Dahl, Photonics Marketplace, Internet Archive from Aug. 24, 2019 (https://www.photonics.com/Articles/Light-Emitting_Diodes_A_Primer/a36706) (Year: 2019).*
Dec. 22, 2020 Search Report issued in International Patent Application No. PCT/JP2020/039026.
Nov. 6, 2023 Extended Search Report issued in European Patent Application No. 20848685.2.

* cited by examiner

ELECTRICITY MEASURING TYPE SURFACE PLASMON RESONANCE SENSOR, ELECTRICITY MEASURING TYPE SURFACE PLASMON RESONANCE SENSOR CHIP, METHOD FOR DETECTING SURFACE PLASMON RESONANCE CHANGES

TECHNICAL FIELD

The present invention relates to an electricity measuring type surface plasmon resonance sensor, an electricity measuring type surface plasmon resonance sensor chip used therefor, and a method for detecting surface plasmon resonance changes using these.

BACKGROUND ART

Surface plasmon resonance (SPR) is a state in which free electrons are in collective oscillatory motion (plasma oscillation) on a metal surface, and is classified into propagating surface plasmon resonance (PSPR) which propagates over a metal surface and localized surface plasmon resonance (LSPR) which is localized at a metal structure in nanometer size. The propagating surface plasmon resonance is a state in which resonance is taking place due to the interaction between the incident light and the electric field produced around the free electrons under plasma oscillation, and an electron compression wave (surface plasmon polariton, SPP) formed by the coupling of the plasma oscillation and the electromagnetic wave traveling along the interface propagates along the metal surface. On the other hand, the localized surface plasmon resonance is a state in which the plasma oscillation polarizes and induces metal nanostructures such as the metal nanoparticles to generate electric dipoles.

The surface plasmon resonance is applied in sensors such as affinity sensors for detecting whether the target substance is adsorbed and the strength of interaction, and for example, Japanese Unexamined Patent Application Publication No. 2011-141265 (PTL 1) describes a sensor chip comprising: a substrate that has a planar portion; and a diffraction grating on the planar portion and having a metal surface, the diffraction grating having a target substance thereon and including a plurality of specific protrusions. However, since it is necessary to use an optical system to detect the change in surface plasmon resonance angle due to the change in the concentration of the target substance present on the metal surface, the sensor chip as described in PTL 1 has problems that the apparatus tends to be expensive or large in size and that it is difficult to achieve integration and a higher throughput achieving processing a large number of samples at the same time.

Moreover, Japanese Unexamined Patent Application Publication No. 2000-356587 (PTL 2) describes a localized plasmon resonance sensor comprising: a sensor unit which includes a substrate and metal fine particles fixed on a surface of the substrate in a film form where the particles do not cling to each other but are separated from each other. However, since the absorbance of the light transmitted between the metal fine particles is measured to detect the change in the refractive index of the medium in the vicinity of the surfaces of the metal fine particles due to adsorption or deposition of the target substance on the metal fine particles, the localized plasmon resonance sensor described in PTL 2 has problems that it is necessary to precisely control the size and arrangement of the metal fine particles and that it is difficult to sufficiently enhance the intensity of the detection signal because the detection signal is the absorbance.

In addition, Japanese Unexamined Patent Application Publication No. 2018-189523 (PTL 3) describes a measuring device comprising: a semiconductor substrate capable of transmitting light having a predetermined wavelength; a metal layer including an antenna portion that forms a Schottky barrier at an interface with the semiconductor substrate and causes surface plasmon resonance when irradiated with light having the predetermined wavelength; and a reaction layer formed on the surface of the metal layer and configured to be reactive with a specific detection substance. However, the measuring device described in PTL 3 has a problem that the sensor accuracy and sensitivity are not yet sufficient.

Furthermore, the surface plasmon resonance is also applied to improve the efficiency of photoelectric conversion in photoelectric conversion elements, and for example, Japanese Unexamined Patent Application Publication No. 2012-38541 (PTL 4) describes a plasmon resonance type photoelectric conversion element comprising: an anode electrode in which a transparent electrode layer, a metal microparticle layer, a semiconductor thin film made of n-type semiconductor, and a pigment adsorption layer are stacked on a transparent substrate in this order, a cathode electrode opposed to the anode electrode across an electrolyte including oxidation-reduction species.

However, if the photoelectric conversion element as described in PTL 4 is applied to a sensor, there are problems that it is necessary to control the metal fine particles, making it difficult to improve the sensor sensitivity as well as that since oxidation and reduction reactions of the electrolyte are involved, the sample itself as the measurement target is oxidized and reduced, affecting the sensor accuracy. Therefore, as an electricity measuring type surface plasmon resonance sensor which enables easy reduction in size and easy achievement of a higher throughput and has a sufficient sensor accuracy, International Publication No. 2019/031591 (PTL 5) describes an electricity measuring type surface plasmon resonance sensor comprising: a plasmon polariton intensifying sensor chip in which a sensor chip including a transparent electrode, an n-type transparent semiconductor film, and a plasmon resonance film electrode arranged in this order, and a prism are arranged; and an electric measuring apparatus which directly measures a current or voltage from the transparent electrode and the plasmon resonance film electrode.

CITATION LIST

Patent Literature

[PTL 1] Japanese Unexamined Patent Application Publication No. 2011-141265
[PTL 2] Japanese Unexamined Patent Application Publication No. 2000-356587
[PTL 3] Japanese Unexamined Patent Application Publication No. 2018-189523
[PTL 4] Japanese Unexamined Patent Application Publication No. 2012-38541
[PTL 5] International Publication No. 2019/031591

SUMMARY OF INVENTION

Technical Problem

The present inventors further studied the electricity measuring type surface plasmon resonance sensor described in PTL 5, and have found that an even higher level of sensitivity may be required in an electricity measuring type surface plasmon resonance sensor chip including a plasmon polariton intensifying sensor chip and an electric measuring apparatus.

The present invention has been made in view of the problems of the conventional art, and an object thereof is to provide an electricity measuring type surface plasmon resonance sensor which enables easy reduction in size and easy achievement of a higher throughput and has a higher sensor sensitivity than that of conventional ones, an electricity measuring type surface plasmon resonance sensor chip used in the same, and a method for detecting surface plasmon resonance changes using these.

Solution to Problem

In an electricity measuring type surface plasmon resonance sensor chip in which an electrode, a semiconductor film, and a plasmon resonance film electrode are arranged in this order (hereinafter simply referred to as the "sensor chip" in some cases) and an electricity measuring type surface plasmon resonance sensor (hereinafter simply referred to as the "sensor" in some cases) using the sensor chip and a prism, light is emitted from the prism side onto the plasmon resonance film electrode, and when the light having passed through the prism totally reflects between the plasmon resonance film electrode and the semiconductor film, energy exudes (evanescent wave) at the backside of the total reflection surface. Thus, when the incident angle of the light to the interface is equal to or greater than the critical angle (hereinafter referred to as the "total reflection angle"), the evanescent wave produced at the site of total reflection and the plasmon resonance film in contact with the backside interact with each other to excite the surface plasmon polaritons. Here, since the incident angle of the incident light can be controlled using the prism and adjusted to the total reflection angle described above, the surface plasmon polaritons produced are sufficiently intensified. The present inventors presume as follows. When the surface plasmon polariton then sufficiently polarizes the plasmon resonance film electrode, hot electrons are emitted and hot holes are formed. The emitted hot electrons can be smoothly transferred to the electrode being the counter electrode through the semiconductor film. Therefore, the sensor chip and the sensor can sufficiently detect the surface plasmon polaritons as an electric signal from the plasmon resonance film electrode and the electrode.

Moreover, the present inventors presume as follows. In the sensor chip and the sensor, the change in refractive index in the vicinity of the plasmon resonance film electrode varies the site of total reflection, that is, the range of incident angle for producing surface plasmon polaritons (incident angle of light entering the prism) as well as the intensity of the surface plasmon polaritons produced. Additionally, since the surface plasmon polaritons intensify the electric field produced in the plasmon resonance film electrode due to the entrance of light, the intensity of electric signal which varies in response to the change in electric field varies depending on the intensity of surface plasmon polaritons. Thus, it is possible to measure with sufficient accuracy the change in refractive index of the sample in the vicinity of the plasmon resonance film electrode. Therefore, the present inventors presume that the sensor chip and the sensor make it possible to highly accurately monitor the concentration change and state change of the sample, and since the detection signal is an electric signal, it is possible to easily enhance the intensity electrically or to easily measure the intensity as a current.

The present inventors have made earnest studies to achieve the above object, and have found as a result that, in the sensor chip and the sensor, use of a silicon semiconductor film as the semiconductor film makes it possible to significantly increase the detected electric signal as compared with the conventional case, and to achieve high sensitivity in the sensor. In addition, while silicon semiconductors absorb light and generate electricity (generate hot electrons) when irradiated with light, the present inventors have found that the effect of increasing the electric signal surprisingly exceeds the theoretical value of the sensitivity increased by the power generation by the silicon semiconductor. Thus, the present invention has been completed.

Specifically, an electricity measuring type surface plasmon resonance sensor of the present disclosure comprises:
a plasmon resonance intensifying sensor chip in which a prism and a sensor chip including an electrode, a silicon semiconductor film, and a plasmon resonance film electrode arranged in this order are arranged in an order of the prism, the electrode, the silicon semiconductor film, and the plasmon resonance film electrode; and an electric measuring apparatus which directly measures a current or voltage from the electrode and the plasmon resonance film electrode.

As a preferable embodiment of the above electricity measuring type surface plasmon resonance sensor, in the sensor chip, a thickness of the plasmon resonance film electrode is preferably 200 nm or less (not including 0).

In addition, as a preferable embodiment of the electricity measuring type surface plasmon resonance sensor, it is preferable that the sensor chip exhibits a rectifying characteristic between the plasmon resonance film electrode and the electrode, and it is more preferable that a combination of the plasmon resonance film electrode and the silicon semiconductor film is a combination which forms a Schottky barrier, and that the silicon semiconductor film includes a pn junction formed therein.

Moreover, as a preferable embodiment of the electricity measuring type surface plasmon resonance sensor, it is preferable that the sensor chip further includes an adhesive layer between the silicon semiconductor film and the plasmon resonance film electrode, it is more preferable that a rectifying characteristic is exhibited between the silicon semiconductor film and the electrode, and it is further preferable that a rectifying characteristic due to the Schottky barrier at an interface between the silicon semiconductor film and the electrode is exhibited.

In addition, as a preferable embodiment of the electricity measuring type surface plasmon resonance sensor, it is preferable that a light transmittance of the silicon semiconductor film at a wavelength of 400 to 700 nm is 1 to 70%.

An electricity measuring type surface plasmon resonance sensor chip of the present disclosure is a sensor chip which is used for the electricity measuring type surface plasmon resonance sensor described above, and includes an electrode, a silicon semiconductor film, and a plasmon resonance film electrode arranged in this order. As a preferable embodiment of the electricity measuring type surface plasmon resonance sensor chip, it is preferable to further comprise an adhesive layer between the silicon semiconductor film and the plasmon resonance film electrode.

A method for detecting surface plasmon resonance changes of the present disclosure is a method for detecting surface plasmon resonance changes using an electricity measuring type surface plasmon resonance sensor including
a plasmon resonance intensifying sensor chip in which a prism and a sensor chip including an electrode, a silicon semiconductor film, and a plasmon resonance film electrode arranged in this order are arranged in an order of the prism, the electrode, the silicon semiconductor film, and the plasmon resonance film electrode, and
an electric measuring apparatus which directly measures a current or voltage from the electrode and the plasmon resonance film electrode, the method for detecting surface plasmon resonance changes comprising:
producing surface plasmon resonance by emitting light onto the prism and allowing the light, passing through the prism, the electrode, and the silicon semiconductor film, to totally reflect between the plasmon resonance film electrode and the silicon semiconductor film to interact with the plasmon resonance film electrode, and producing hot electrons by subjecting the light having passed through the prism and electrode and the totally reflected light to light absorption in the silicon semiconductor film;
picking up hot electrons produced by light absorption in the silicon semiconductor film, or hot electrons produced by light absorption in the silicon semiconductor film and hot electrons produced by the surface plasmon resonance and transferred to the silicon semiconductor film, as an electric signal from the electrode; and
measuring a change in current or voltage between the electrode and the plasmon resonance film electrode with the electric measuring apparatus.

As a preferable embodiment of the method for detecting surface plasmon resonance changes, it is preferable that a wavelength of the light emitted onto the prism is 400 to 700 nm.

Advantageous Effects of Invention

The present invention makes it possible to provide an electricity measuring type surface plasmon resonance sensor which enables easy reduction in size and easy achievement of a higher throughput and has a higher sensor sensitivity than that of conventional ones, an electricity measuring type surface plasmon resonance sensor chip used in the same, and a method for detecting surface plasmon resonance changes using these.

DESCRIPTION OF EMBODIMENTS

Figure 1A:
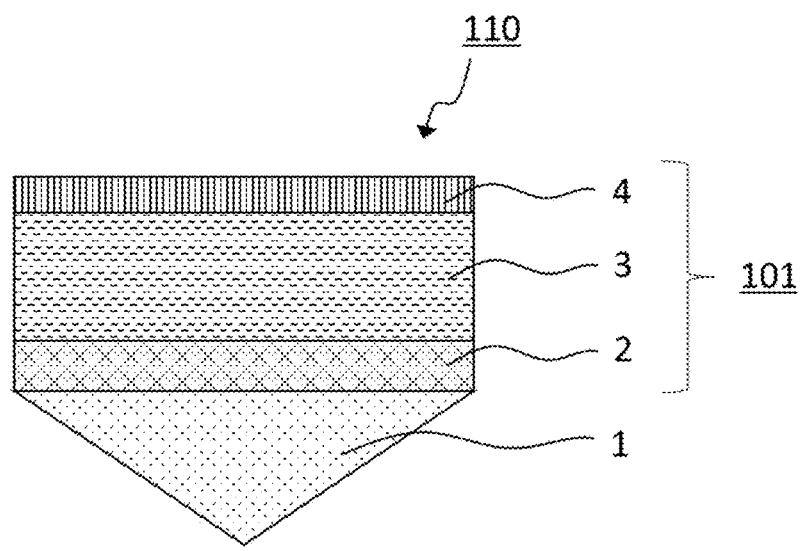
FIG. 1A is a schematic vertical cross-sectional view illustrating Preferable Embodiment 1 of a plasmon resonance intensifying sensor chip.

Hereinafter, the present invention is described in detail with reference to its preferable Embodiments. An electricity measuring type surface plasmon resonance sensor of the present disclosure comprises:
a plasmon resonance intensifying sensor chip in which a prism and a sensor chip including an electrode, a silicon semiconductor film, and a plasmon resonance film electrode arranged in this order are arranged in an order of the prism, the electrode, the silicon semiconductor film, and the plasmon resonance film electrode; and
an electric measuring apparatus which directly measures a current or voltage from the electrode and the plasmon resonance film electrode. In addition, an electricity measuring type surface plasmon resonance sensor chip of the present disclosure is a sensor chip which is used for the electricity measuring type surface plasmon resonance sensor of the present disclosure described above, and includes an electrode, a silicon semiconductor film, and a plasmon resonance film electrode arranged in this order.

Hereinafter, specific description is provided taking examples of preferable embodiments of the electricity measuring type surface plasmon resonance sensor (hereinafter, the "sensor"), the plasmon resonance intensifying sensor chip (hereinafter, the "intensifying sensor chip"), and the electricity measuring type surface plasmon resonance sensor chip (hereinafter, the "sensor chip") with reference to the drawings, but the present invention is not limited to these. Note that in the following description and drawings, the same or corresponding elements are denoted by the same reference numerals, and redundant description is omitted.

FIG. 1A illustrates a first preferable embodiment of the intensifying sensor chip (Preferable Embodiment 1; intensifying sensor chip 110). As illustrated in FIG. 1A, the intensifying sensor chip 110 of Preferable Embodiment 1 is a stack of a prism (hereinafter, the prism 1) having on its top a sensor chip (photoelectric conversion unit; sensor chip 101 in Preferable Embodiment 1) composed of an electrode (hereinafter, the electrode 2), a silicon semiconductor film (hereinafter, the silicon semiconductor film 3), and a plasmon resonance film electrode (hereinafter, the plasmon resonance film electrode 4) in the order of the prism 1, the electrode 2, the silicon semiconductor film 3, and the plasmon resonance film electrode 4.

Figure 1B:
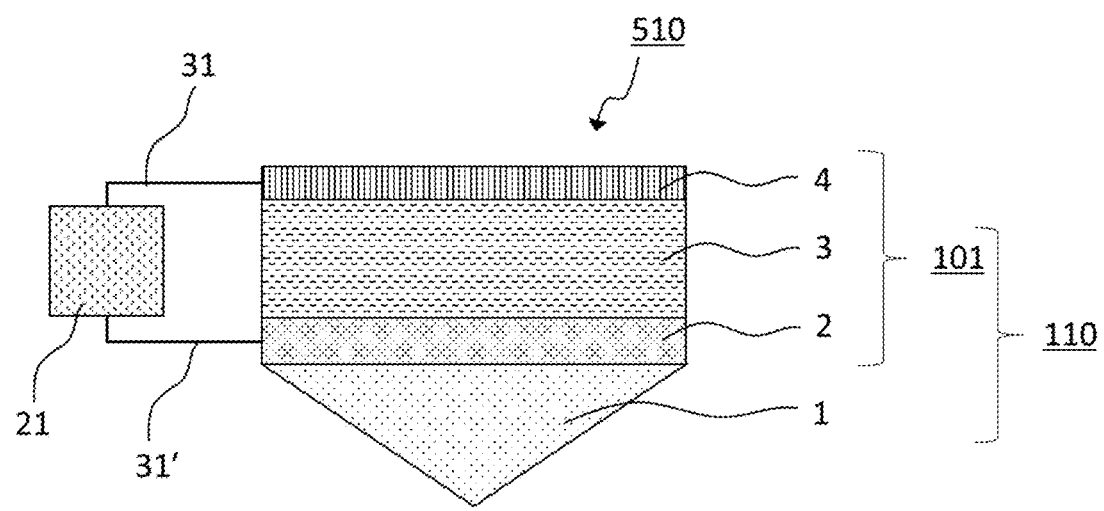
FIG. 1B is a schematic vertical cross-sectional view illustrating Preferable Embodiment 1 of an electricity measuring type surface plasmon resonance sensor.

In addition, FIG. 1B illustrates a first preferable embodiment of a sensor (Preferable Embodiment 1; sensor 510). As illustrated in FIG. 1B, the sensor 510 of Preferable Embodiment 1 includes an intensifying sensor chip 110 which is provided with the prism 1 and the sensor chip 101 and an electric measuring apparatus (electric measuring apparatus 21) which is electrically connected via external circuits (external circuits 31 and 31') to the electrode 2 and the plasmon resonance film electrode 4 of the sensor chip 101.
(Prism)

The prism 1 has a function of allowing incident light to totally reflect between the silicon semiconductor film and the plasmon resonance film electrode 4. Specifically, in the embodiment of the present disclosure, the prism 1 controls the angle of the incident light so as to satisfy the conditions for total reflection between the silicon semiconductor film 3 and the plasmon resonance film electrode 4 (so as to allow incident light to totally reflect between the silicon semiconductor film 3 and the plasmon resonance film electrode 4). Then, the incident light whose angle has been controlled by the prism 1 is totally reflected between the silicon semiconductor film 3 and the plasmon resonance film electrode 4, that is, at the interface between the plasmon resonance film electrode 4 and the silicon semiconductor film 3. Note that, when the adhesive layer to be described later is further provided, the incident light whose angle has been controlled by the prism 1 is totally reflected at the interface between the plasmon resonance film electrode 4 and the adhesive layer or at the interface between the adhesive layer and the silicon semiconductor film 3. Moreover, when there are two or more adhesive layers to be described later, the incident light whose angle has been controlled by the prism 1 is totally reflected at the interface between the plasmon resonance film electrode 4 and the adhesive layer, the interface between the adhesive layer and the silicon semiconductor film 3, or the interface between the two adjacent adhesive layers. Examples of the prism 1 include triangle prisms in the shape of a triangular prism (such as right-angled prisms (isosceles right triangles with 45° corners and right triangles with 60° and 30° corners) and equilateral triangle prisms); trapezoidal prisms in the shape of a trapezoid column; cylindrical prisms in which a face of the cylinder is a planar shape (the length of the side (short side) between the planar surface (rect-angle) and the upper face and the bottom face of the cylinder may be less than the diameter of the circle of the upper face and the bottom face); spherical prisms in which one of the faces of the sphere is a planar shape (the diameter of the face (circle) may be less than the diameter of the sphere); and pentaprisms in the shape of a pentagon prism. Among these, the prism 1 is preferably the triangular prism as illustrated in FIG. 1A as well as the trapezoidal prism, the cylindrical prism, or the spherical prism and more preferably the right-angled prism; a semi-cylindrical prism whose short side has a length equal to the diameter of the circle of the upper face and the bottom face; or a semi-spherical prism in which the diameter of the circle as the planar surface is equal to the diameter of the sphere from the viewpoint that the incident light entering the prism tends to more efficiently reach the plasmon resonance film electrode 4.

As to the sensor, one sensor chip (photoelectric conversion unit) may be provided with one prism 1 or two or more prisms 1 in the form of an array, and two or more photoelectric conversion units may be provided with one prism 1.

The size of the prism 1 is not particularly limited, and the length of the longest side in the case where the surface in contact with the sensor chip is polygonal, or the length of the diameter of the circumscribed circle of the surface in contact with the sensor chip in other cases is preferably 10 nm to 10 cm, more preferably 50 nm to 5 cm, and further preferably 100 nm to 3 cm. Note that it is possible to mold prisms of nanometer size to micrometer size using patterning techniques such as laser ablation, electron beam lithography, nanoimprint lithography, and optical interference lithography, and prisms of micrometer size or larger can be obtained by optical polishing after cutting. When the size of the prism 1 is less than the lower limit, the manufacturing difficulty increases and the performance as a prism decreases, and as a result the performance as a sensor tends to decrease. On the other hand, when the size of the prism 1 exceeds the upper limit, downsizing as a sensor tends to be difficult.

When the prism 1 is a triangular prism, the electrode 2, the silicon semiconductor film 3, and the plasmon resonance film electrode 4 are preferably arranged on one of the faces of the triangular prism as illustrated in FIG. 1A, and light preferably enters a face other than the inclined face. In addition, when the prism 1 is a trapezoidal prism, the electrode 2, the silicon semiconductor film 3, and the plasmon resonance film electrode 4 are preferably arranged on one of the faces of the trapezoidal prism including the lower bottom edges (lower bottom face) of the trapezoid, and light preferably enters a face serving as a hypotenuse of the trapezoid.

In each of the triangular prism and the trapezoidal prism, the angle formed by the face of the prism entered by the incident light and the face in contact with the sensor chip (sensor chip 101 in Preferable Embodiment 1) is preferably 5 to 85°, more preferably 15 to 75°, and further preferably 25 to 65°.

Moreover, when the prism 1 is a cylindrical prism or a spherical prism, the planar surface thereof preferably has the electrode 2, the silicon semiconductor film 3, and the plasmon resonance film electrode 4 arranged thereon, and light preferably enters the curved face.

As to the cylindrical prism, let the diameter of the cylinder be 1 and the planar surface be the bottom face. Consider a line extending from the center of the bottom face in the vertical direction and intersecting with an arc. The ratio of the distance between the center of the bottom face being the intersection (hereinafter referred to as the "prism height") to the diameter of the cylinder (prism height/diameter of the cylinder) is preferably less than 1 (exclusive of 0), more preferably 0.2 or more and less than 0.8, and further preferably 0.4 or more and less than 0.6.

As to the spherical prism, let the diameter of the sphere be 1 and the planar surface be the bottom face. The ratio of the height from the center of the bottom face (hereinafter referred to as the "prism height") to the diameter of the sphere (prism height/diameter of the sphere) is preferably less than 1 (exclusive of 0), more preferably 0.2 or more and less than 0.8, and further preferably 0.4 or more and less than 0.6.

When the angle or the prism height of the triangular prism, the cylindrical prism, and the spherical prism is less than the lower limit or exceeds the upper limit, it tends to be difficult to allow entrance of light at an incident light angle which can excite surface plasmon resonance (especially surface plasmon polaritons) or the sensitivity and accuracy of the sensor tend to decrease due to multiple reflection of light inside the prism.

In addition, when the prism 1 is a pentaprism, the electrode 2, the silicon semiconductor film 3, and the plasmon resonance film 4 are preferably arranged on any of the lateral faces of the pentagonal prism, and light preferably enters any of the remaining four lateral faces.

The material of the prism 1 is not particularly limited, and examples thereof include glass, macromolecule polymers (such as poly(methylmethacrylate), polystyrene, polyethylene, epoxy, and polyester), sulfur, ruby, sapphire, diamond, zinc selenide (ZnSe), zinc sulfide (ZnS), germanium (Ge), silicon (Si), cesium iodide (CsI), potassium bromide (KBr), thallium bromoiodide, calcium carbonate ($CaCO_3$), barium fluoride ($BaF_2$), magnesium fluoride ($MgF_2$), and lithium fluoride (LiF). In addition, the material of the prism 1 may be a liquid, and examples thereof include water, oil, glycerol, diiodomethane, α-bromonaphthalene, toluene, isooctane, cyclohexane, 2,4-dichlorotoluene, ethylbenzene, dibenzyl ether, aniline, styrene, organic compound solutions (such as sucrose solution), and inorganic compound solutions (such as potassium chloride solution and sulfur-containing solution). These may be used singly or two or more kinds thereof may be used in combination.

Note that a light source of incident light may be arranged inside the prism 1 regardless of the shape and material of the prism 1.

(Electrode)

The electrode 2 mainly has a function of picking up as an electric signal the hot electrons (electrons) produced by light absorption in the silicon semiconductor film 3, or the hot electrons produced by light absorption in the silicon semiconductor film 3 and the hot electrons emitted in association with the surface plasmon resonance produced in the plasmon resonance film electrode 4 and moved through the silicon semiconductor film 3 (preferably the hot electrons produced by light absorption in the silicon semiconductor film 3 and the hot electrons emitted in association with the surface plasmon resonance produced in the plasmon resonance film electrode 4 and moved through the silicon semiconductor film 3), functions as a counter electrode of the plasmon resonance film electrode 4, and is electrically connected to the plasmon resonance film electrode 4 via an electric measuring apparatus (electric measuring apparatus 21 in Preferable Embodiment 1) and external circuits (such as conductive wire and an ammeter; external circuits 31 and 31' in Preferable Embodiment 1) if necessary. In addition, the electrode 2 needs to be able to transmit at least light.

It is possible to appropriately select the material of the electrode 2 from those conventionally used as an electrode in the field of semiconductors, and examples thereof include copper (Cu), gold (Au), silver (Ag), platinum (Pt), zinc (Zn), chromium (Cr), aluminum (Al), titanium (Ti), titanium nitride (TiN), ITO (Indium tin oxide), FTO (Fluorine-doped tin oxide), transparent conductive materials including a metal oxide such as ZnO doped with other elements (aluminum, gallium, and the like), and shapes of thin film or net composed of laminates thereof. As the light transmittance of the electrode 2 in this case, it is preferable that as much light as possible can be transmitted, and the light transmittance when light of at least any wavelength of 400 to 1500 nm is vertically incident on one surface of the electrode 2 is preferably 40% or more, more preferably 50% or more, and further preferably 60% or more.

In addition, as the electrode 2, the following silicon semiconductor film 3 may also serve as the electrode 2. As the light transmittance of the electrode in this case, from the viewpoint of providing the following functions as a silicon semiconductor film, the light transmittance when light of at least any wavelength of 400 to 1500 nm is vertically incident on one surface of the electrode 2 is preferably 1 to 80%, more preferably 5 to 70%, and further preferably 5 to 50%. Moreover, as the light transmittance of the electrode 2 in this case, the light transmittance at a wavelength of 400 to 700 nm or preferably the light transmittance at a wavelength of 675 nm is even more preferably 1 to 70%, particularly preferably 5 to 70%, and most especially preferably 5 to 50%.

The thickness of the electrode 2 is usually 1 to 1000 nm. When the silicon semiconductor film 3 described below also serves as the electrode 2, it is preferably 5 to 750 nm, and more preferably 10 to 500 nm. Note that the interface and the thicknesses of the film, the electrode, the layer, the substrate, or the like can be determined and measured by observation with a scanning electron microscope (SEM) or a transmission electron microscope (TEM).

(Silicon Semiconductor Film)

The silicon semiconductor film 3 is a film made of a silicon semiconductor. The silicon semiconductor film 3 mainly has a function of absorbing light incident on the silicon semiconductor film 3 (incident light and further, reflected light by the plasmon resonance film electrode 4) to generate power by itself, or has the above-mentioned function and a function of receiving hot electrons emitted when the plasmon resonance film electrode 4 is sufficiently polarized by the surface plasmon resonance excited by the plasmon resonance film electrode 4. In the present invention, surprisingly, when a silicon semiconductor film is used as the semiconductor film for the intensifying sensor chip, the absolute value of the variation in the current or voltage value (preferably the current value) measured from the plasmon resonance film electrode 4 increases beyond the theoretical value calculated from the amount of power generated by the silicon semiconductor.

Figure 2:
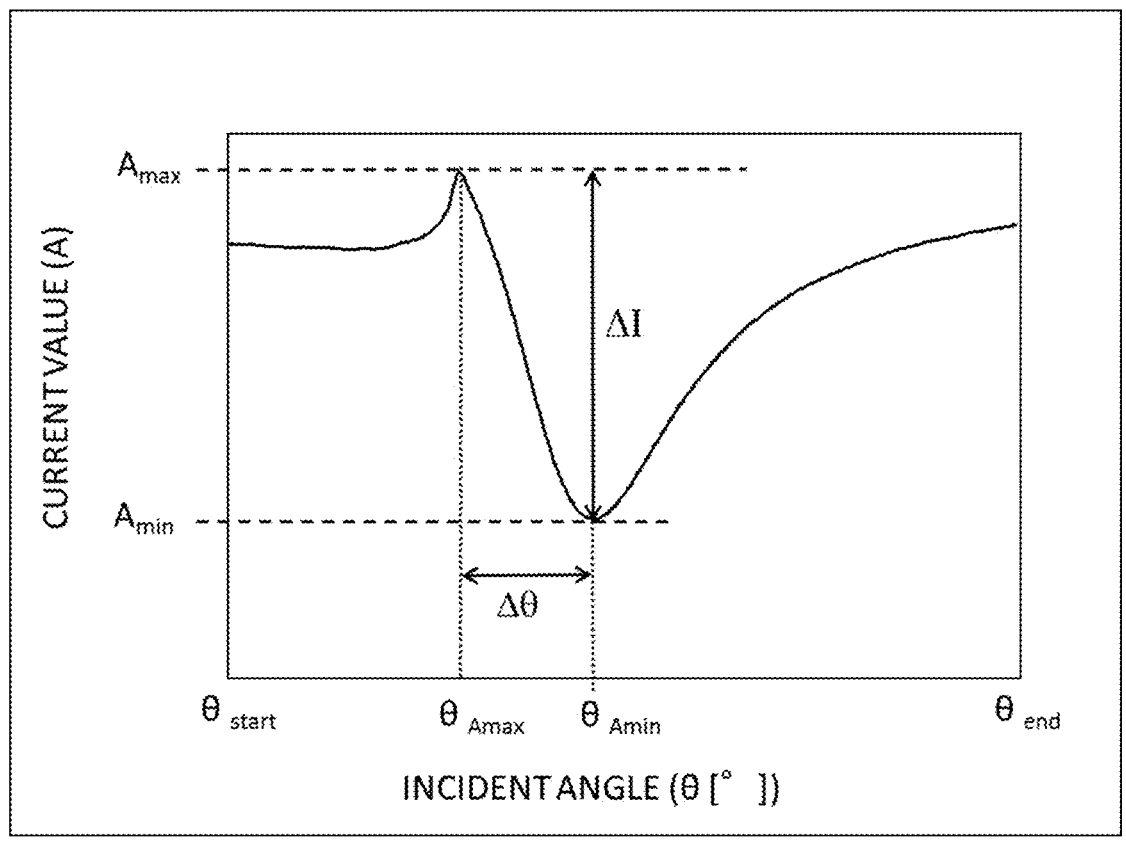
FIG. 2 is a graph illustrating an example of the relationship between the incident angle and the current value when light is incident on the sensor chip and the current value is measured.

Specifically, first, in the present invention, the sensor sensitivity is shown, as an example, by the waveform of a graph illustrating the relationship between the incident angle (θ) and the current value (A) (FIG. 2) when light is incident on the sensor chip and the current value is measured within the range where the incident angle (e) with respect to the surface of the electrode (or transparent substrate) of the sensor chip is 0 to 90°. The range of the incident angle (e) here is within a range of ±25° of the incident angle (total reflection angle ($θ_{cp}$)) when the incident light is totally reflected between the plasmon resonance film electrode and the semiconductor film (when SPR (PSPR) is produced), and within a range where the angle is increased from an incident angle ($\theta_{start}$) start) smaller than $\theta_{cp}$ by several degrees in the direction of total reflection angle, exceeds the incident angle (resonance angle ($\theta_{Amin}$)) at which the current value becomes the minimum value ($A_{min}$), and reaches the incident angle ($\theta_{end}$) at which the variation in the current value is constant. Note that A indicates a constant value in a range where the incident angle is smaller than $\theta_{start}$. If plasmon resonance occurs when light is incident on the sensor chip and the current value is measured, the current value (A) is observed as a minimum value ($A_{min}$) as illustrated in FIG. 2. At this time, it is shown that the sensor sensitivity is higher with the increase in the difference between the maximum value ($A_{max}$) and the minimum value ($A_{min}$) in the obtained waveform, that is, the drop in the minimum value ($\Delta I$). In FIG. 2, the incident angle $\theta_{Amax}$ at which A is the maximum value ($A_{max}$) is smaller than $\theta_{Amin}$ but may be larger than $\theta_{Amin}$ depending on $A_{max}$ as long as it is within the range of ±25° of $\theta_{cp}$. Note that the waveform of the above graph may be upside down, and $\Delta I$ indicating the sensor sensitivity in this case is represented by the magnitude of the ridge of the maximum value when the current value (A) is observed as the maximum value.

For example, in the following intensifying sensor chip 120 illustrated in FIG. 4, if the following conditions (1) to (6) are given:

(1) let a be the light absorption rate of the silicon semiconductor film 3;
(2) let the light intensity of the incident light be 1;
(3) if light is emitted onto the prism 1 and the light passing through the prism 1, the transparent substrate 5, the electrode 2, and the silicon semiconductor film 3 does not produce plasmon resonance, it is assumed that 100% reflection occurs at the interface of the silicon semiconductor film 3 opposite to the side in contact with the electrode 2 when the incident angle is equal to or greater than the total reflection angle ($\theta_{cp}$) (reflected light intensity=1−a);
(4) the power generation amount inside the silicon semiconductor film 3 is constant inside the film (absorption rate=power generation amount: the power generation amount due to incident light=1×a=a, and the power generation amount due to reflected light=(1−a)×a=(1−a)a);
(5) let X be the reduction rate of incident light at the resonance angle (SPR angle: $\theta_{Amin}$) at the plasmon resonance film electrode 4; and
(6) it is assumed that the power generation amount inside the silicon semiconductor film 3 is sufficiently larger than the power generation amount inside the plasmon resonance film electrode 4 (ignoring the power generation by the plasmon resonance film electrode 4 itself), the total power generation amount by the incident light and the reflected light in the silicon semiconductor film 3 is a+(1−a) a, and the total power generation amount when the light is reduced by the plasmon resonance film electrode 4 at the SPR angle (when the plasmon resonance occurs) is a+(1−X) (1−a)a. Therefore, the reduction rate of the power generation amount at the SPR angle is indicated by {a+(1−a)a}−{a+(1−X) (1−a) a}. Here, if the values presented in Table 1 below are used as the light absorption rate (a, %) in silicon and the light reduction rate (%) at the SPR angle, the relationship between the light absorption rate (%) in silicon and the theoretical value (power generation reduction rate, %) of the reduction rate of the power generation amount at the SPR angle is illustrated in FIG. 3.

TABLE 1

| Light Absorption Rate in Silicon (%) | Light Reduction Rate at SPR Angle (%) | | | | | |
|---|---|---|---|---|---|---|
| | 0 | 20 | 40 | 60 | 80 | 100 |
| 0 | 0 | 0 | 0 | 0 | 0 | 0 |
| 10 | 0 | 1.8 | 3.6 | 5.4 | 7.2 | 9 |
| 20 | 0 | 3.2 | 6.4 | 9.6 | 12.8 | 16 |
| 30 | 0 | 4.2 | 8.4 | 12.6 | 16.8 | 21 |
| 40 | 0 | 4.8 | 9.6 | 14.4 | 19.2 | 24 |
| 50 | 0 | 5 | 10 | 15 | 20 | 25 |
| 60 | 0 | 4.8 | 9.6 | 14.4 | 19.2 | 24 |
| 70 | 0 | 4.2 | 8.4 | 12.6 | 16.8 | 21 |
| 80 | 0 | 3.2 | 6.4 | 9.6 | 12.8 | 16 |
| 90 | 0 | 1.8 | 3.6 | 5.4 | 7.2 | 9 |
| 100 | 0 | 0 | 0 | 0 | 0 | 0 |

Figure 3:
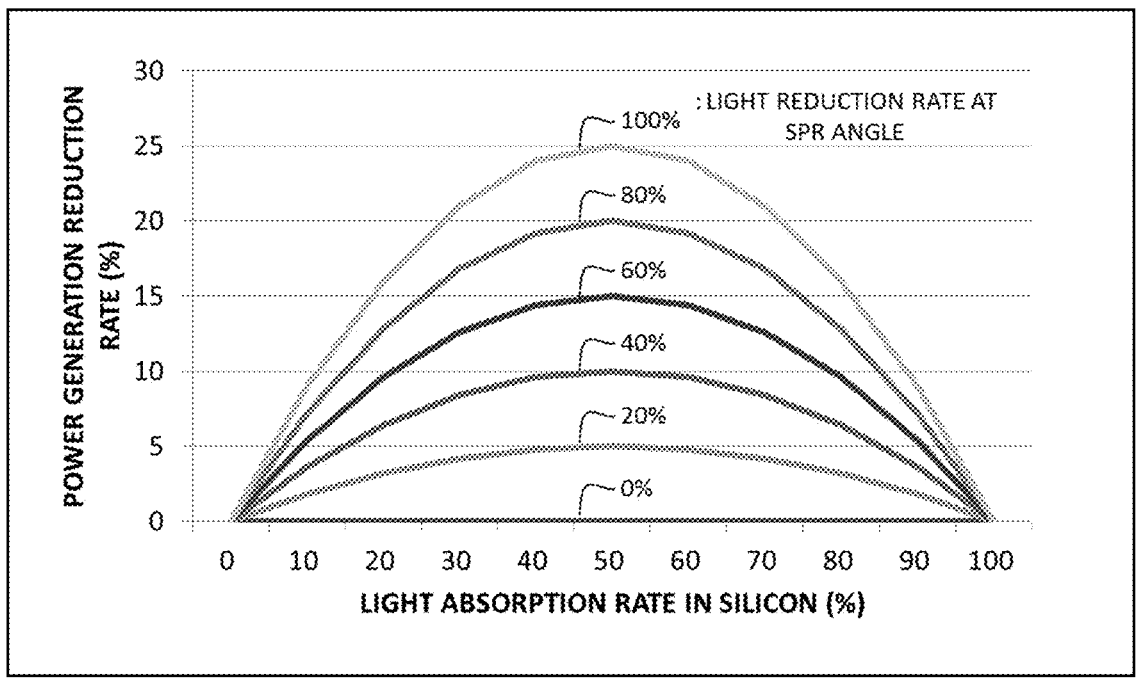
FIG. 3 is a graph illustrating the relationship between the light absorption rate in silicon and the theoretical value of the reduction rate of the power generation amount at the incident angle (SPR angle) of light at which the power generation amount shows the minimum value during surface plasmon resonance.

From FIG. 3, the theoretical value of the reduction rate of the power generation amount at the SPR angle is 25% at the maximum. However, when the current value is measured with the intensifying sensor using the sensor chip including the silicon semiconductor film of the present disclosure, the sensor sensitivity ($\Delta I$) is greater than the maximum value (25%) of the theoretical value as compared with the case where the silicon semiconductor is not used (for example, in comparison between Example 1 and Comparative Example 1, there is an increase of about 65%).

The silicon semiconductor as the material of the silicon semiconductor film 3 may be an n-type semiconductor or a p-type semiconductor, may be undoped silicon (non-doped silicon, for example, high-purity silicon having a purity of 99.99% or more), or may be one of these alone or a composite material of two or more kinds. Examples of the n-type semiconductor include those doped with phosphorus (P), antimony (Sb), and arsenic (As), and examples of the p-type semiconductor include those doped with boron (B), aluminum (Al), and gallium (Ga).

Among these, in the case of using the rectifying characteristic due to the Schottky barrier with the plasmon resonance film electrode 4, the silicon semiconductor is preferably an n-type semiconductor or non-doped silicon, and more preferably an n-type semiconductor, from the viewpoint that a Schottky barrier tends to be formed at the interface with the plasmon resonance film electrode 4 (or the interface with the adhesive layer 6 when the adhesive layer 6 is further provided). Moreover, in the case of using the rectifying characteristic due to the Schottky barrier with the electrode 2, an n-type semiconductor or non-doped silicon is preferable. In addition, in the case of using the rectifying characteristics by the pn junction, a combination of two or more kinds of n-type semiconductor, p-type semiconductor, and non-doped silicon is preferable, and a combination of n-type semiconductor and p-type semiconductor is more preferable. Here, the order of stacking is not particularly limited, but it is preferable to stack the electrode 2, a film made of n-type semiconductor, a film made of p-type semiconductor, and the plasmon resonance film electrode 4 in this order.

In addition, the silicon semiconductor film 3 needs to be capable of transmitting at least light from the viewpoint of increasing the sensor sensitivity while producing plasmon resonance. As the light transmittance of such a silicon semiconductor film 3, the light transmittance when light of at least any wavelength of 400 to 1500 nm is vertically incident on one surface of the silicon semiconductor film 3 is preferably 1 to 80%, more preferably 5 to 70%, and further preferably 5 to 50%. Further, as the light transmittance of the silicon semiconductor film 3, the light transmittance at a wavelength of 400 to 700 nm or preferably the light transmittance at a wavelength of 675 nm is even more preferably 1 to 70%, particularly preferably 5 to 70%, and most especially preferably 5 to 50%.

The thickness of the silicon semiconductor film 3 is preferably 1000 nm or less (not including 0), more preferably 1 to 1000 nm, further preferably 5 to 750 nm, and even more preferably 10 to 500 nm. When the thickness is less than the lower limit, the silicon semiconductor cannot exist as a film and tends to fail to achieve a sufficient function as a semiconductor. Meanwhile, when the upper limit is exceeded, the light transmittance decreases, the light intensity reaching the plasmon resonance film electrode decreases, and plasmon resonance tends to be less likely to occur.

(Plasmon Resonance Film Electrode)

The plasmon resonance film electrode 4 has a function of converting entering light (incident light) into surface plasmon resonance (especially surface plasmon polaritons) and is a film made of a plasmonic material capable of producing surface plasmon resonance by the interaction with light. Also, the plasmon resonance film electrode has a function of picking up the surface plasmon resonance as an electric signal, functions as a counter electrode of the electrode 2, and is electrically connected to the electrode 2 via an electric measuring apparatus (electric measuring apparatus 21 in Preferable Embodiment 1) and external circuits (such as conductive wire and an ammeter; external circuits 31 and 31' in Preferable Embodiment 1) if necessary.

Examples of the plasmonic material include metals, metal nitrides, and metal oxides, and these may be used singly or two or more kinds thereof may be used as a composite material. Among these, as the plasmonic material, preferable examples of the metals can include gold (Au), silver (Ag), aluminum (Al), copper (Cu), platinum (Pt), palladium (Pd), zinc (Zn), and sodium (Na), preferable examples of the metal nitrides can include titanium nitride (TiN), and preferable examples of the metal oxides can include ITO (Indium tin oxide), FTO (Fluorine-doped tin oxide), and ZnO doped with other elements (aluminum, gallium, and the like). Among these, the plasmonic material is preferably at least one selected from the group consisting of Au, Ag, Al, Cu, Pt, Pd, and TiN and is more preferably at least one selected from the group consisting of Au, Ag, Al, Cu, and Pt.

The thickness of the plasmon resonance film electrode 4 is preferably 200 nm or less (not including 0), more preferably 1 to 200 nm, further preferably 1 to 150 nm, still more preferably 5 to 100 nm, and still more preferably 10 to 60 nm. When the thickness is less than the lower limit, the plasmon resonance film electrode tends to fail to exist as a film. On the other hand, when the thickness exceeds the upper limit, there is a tendency that the evanescent wave reaching the surface opposite to the surface entered by light weakens, which makes it impossible to excite sufficient surface plasmon resonance (especially surface resonance polaritons). In addition, the thickness of the plasmon resonance film electrode 4 is particularly preferably 10 to 34 nm from the viewpoint of making it possible to measure refractive indices in a wider range (preferably 1.33 to 1.40) as the refractive index of the sample as the measurement target, and is particularly preferably 35 to 60 nm from the viewpoint of increasing the rate of change in the current value relative to the change in the refractive index.

Figure 4:
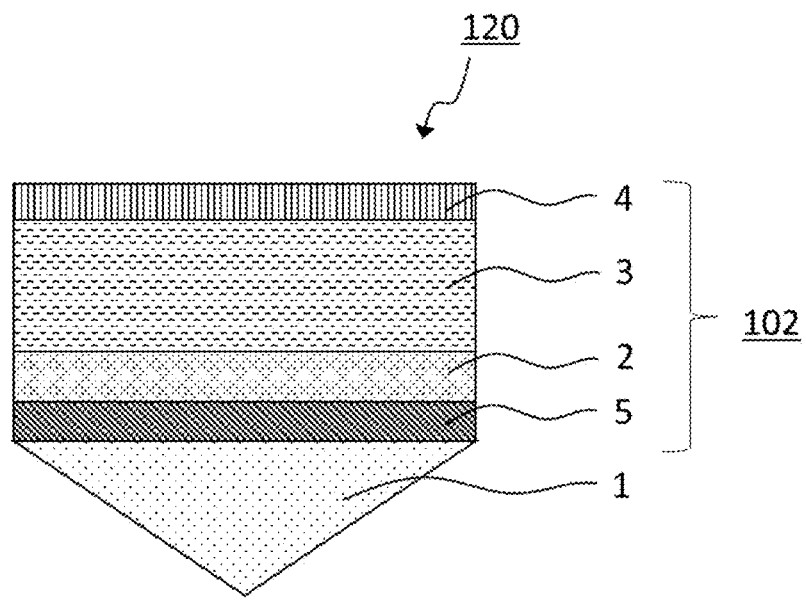
FIG. 4 is a schematic vertical cross-sectional view illustrating Preferable Embodiment 2 of a plasmon resonance intensifying sensor chip.

FIG. 4 illustrates a second preferable embodiment (Preferable Embodiment 2) of the intensifying sensor chip. The sensor chip constituting the intensifying sensor chip may further include another layer as long as the effects of the present invention are not impaired. For example, as in the case of the sensor chip (photoelectric conversion unit) 102 illustrated in FIG. 4, the sensor chip may further include a transparent substrate 5 between the prism 1 and the electrode 2 mainly in order to support the sensor chip 101 (intensifying sensor chip 120). The material of the transparent substrate 5 is not particularly limited as long as it is able to transmit light, and examples thereof include glass; and polymer organic compounds such as plastics and films. The transparent substrate 5 may be a single layer containing one of these or a multilayer formed by stacking two or more of such single layers. In the case of further including the transparent substrate 5, its thickness is usually 0.01 to 2 mm.

Additionally, in the case of further including the transparent substrate 5, an intermediate layer (not illustrated) may be further provided mainly in order to closely adhere to the transparent substrate 5. The material of the intermediate layer is not particularly limited as long as it is able to transmit light, and examples thereof include glycerol, water, macromolecule polymers (such as poly(methylmethacrylate), polystyrene, polyethylene, epoxy, and polyester), oil, diiodomethane, α-bromonaphthalene, toluene, isooctane, cyclohexane, 2,4-dichlorotoluene, organic compound solutions (such as sucrose solution), inorganic compound solutions (such as potassium chloride solution and sulfur-containing solution), ethylbenzene, dibenzyl ether, aniline, and styrene. These may be used singly or two or more kinds thereof may be used in combination.

Preferably, the light transmittances of the transparent substrate 5 and the intermediate layer in the above case can each independently transmit as much light as possible. The light transmittance when light of at least any wavelength of 400 to 1500 nm is vertically incident on one surface of the transparent substrate 5 or intermediate layer is preferably 40% or more, more preferably 50% or more, and further preferably 60% or more.

Figure 5:
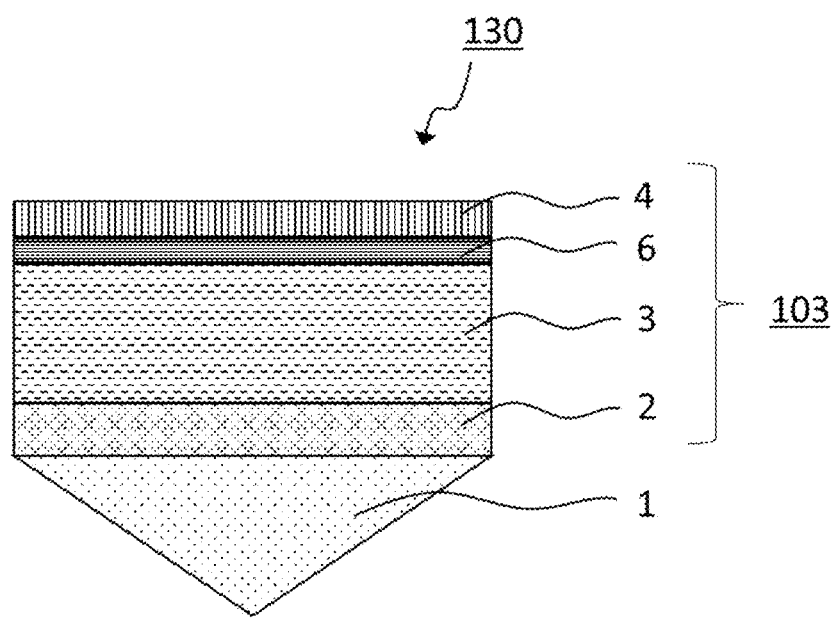
FIG. 5 is a schematic vertical cross-sectional view illustrating Preferable Embodiment 3 of a plasmon resonance intensifying sensor chip.

FIG. 5 illustrates a third preferable embodiment (Preferable Embodiment 3) of the intensifying sensor chip. As in the case of the sensor chip (photoelectric conversion unit) 103 illustrated in FIG. 5, the sensor chip constituting the intensifying sensor chip may further include an adhesive layer 6 between the silicon semiconductor film 3 and the plasmon resonance film electrode 4 mainly in order to more firmly fix the plasmon resonance film electrode 4 (intensifying sensor chip 130). Examples of the material of the adhesive layer 6 include titanium (Ti), chromium (Cr), nickel (Ni), and titanium nitride (TiN), and include non-doped silicon (Si) when the silicon semiconductor film 3 is made of a silicon semiconductor other than non-doped silicon. The adhesive layer may be a single layer containing one of these or a multilayer formed by stacking two or more of such single layers. In addition, the adhesive layer 6 does not have to cover the entire boundary interface between the silicon semiconductor film 3 and the plasmon resonance film electrode 4. Note that there is a tendency that the evanescent wave reaching the surface opposite to the surface entered by light weakens, which makes it impossible to excite surface plasmon polaritons of sufficient strength. For this reason, in the sensor chip, the silicon semiconductor film 3 and the plasmon resonance film electrode 4 are preferably arranged in the vicinity of each other, and the distance between the silicon semiconductor film 3 and the plasmon resonance film electrode 4 is preferably 25 nm or less and more preferably 1 to 10 nm. Therefore, in the case of further including the adhesive layer 6, its thickness is preferably 25 nm or less, more preferably 1 to 25 nm, and further preferably 1 to 10 nm.

When the adhesive layer 6 is further provided, the adhesive layer 6 is particularly preferably an ohmic connecting layer. In the present invention, the "ohmic connecting layer" refers to a layer having a function of eliminating the rectifying characteristic between the two layers (in the present invention, between the silicon semiconductor film 3 and the plasmon resonance film electrode 4). When a metal layer, a semiconductor layer, and an electrode that cause plasmon resonance are arranged in this order, the Schottky barrier between the semiconductor and the electrodes is low, and thus it has conventionally been considered that the rectifying characteristic is not exhibited in between (for example, between 5 and 34 in FIGS. 3 and 4 of PTL 3). However, in the present invention, in the setup where an adhesive layer is further provided on the side of the silicon semiconductor film 3 opposite to the electrode 2 and is used as the ohmic connecting layer, the Schottky barrier between the silicon semiconductor film 3 and the plasmon resonance film electrode 4 is eliminated, and the junction between them is a junction without rectifying characteristic (ohmic junction), the present inventors have found that the Schottky barrier between the silicon semiconductor film 3 and the electrode 2 becomes relatively high, and as a result, the variation in the measured current value becomes even larger, that is, the sensitivity becomes higher.

Examples of the material of the adhesive layer 6 as the ohmic connecting layer include titanium (Ti), chromium (Cr), and titanium nitride (TiN), and include non-doped silicon (Si) when the silicon semiconductor film 3 is made of a silicon semiconductor other than non-doped silicon. The adhesive layer 6 as the ohmic connecting layer may be a single layer containing one of these, or may be a plurality of layers formed by stacking two or more such single layers. In addition, the adhesive layer 6 as the ohmic connecting layer preferably covers the entire boundary surface between the silicon semiconductor film 3 and the plasmon resonance film electrode 4, and the thickness thereof is preferably 1 to 50 nm, and more preferably 1 to 25 nm.

Figure 6:
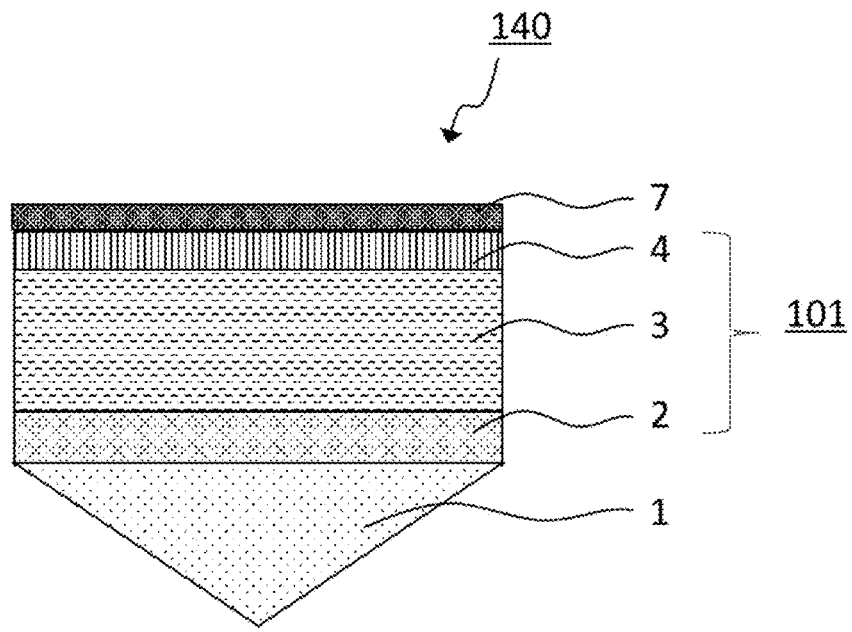
FIG. 6 is a schematic vertical cross-sectional view illustrating Preferable Embodiment 4 of a plasmon resonance intensifying sensor chip.

FIG. 6 illustrates a fourth preferable embodiment (Preferable Embodiment 4) of the intensifying sensor chip. As illustrated in FIG. 6, the intensifying sensor chip may further include a protection film 7 on the exposed surface of the plasmon resonance film electrode 4 (on the surface opposite to the silicon semiconductor film 3) mainly in order to protect the exposed surface (intensifying sensor chip 140). Examples of the material of the protection film 7 include glass, plastics, titanium dioxide (TiO$_2$), magnesium fluoride (MgF$_2$), tantalum pentoxide (Ta$_2$O$_5$), aluminum oxide (Al$_2$O$_3$), diamond like carbon, and silicon carbide, and the protection film 7 may be a single layer containing one of these or a multilayer formed by stacking two or more of such single layers. Note that the reach of the surface plasmon polaritons produced in the plasmon resonance film electrode 4 is within about 300 nm from the surface of the plasmon resonance film electrode. For this reason, in the case of further including the protection film 7, its thickness is preferably 300 nm or less, more preferably 200 nm or less, and further preferably 100 nm or less. The lower limit of the thickness of the protection film 7 is usually 1 nm.

Figure 7:
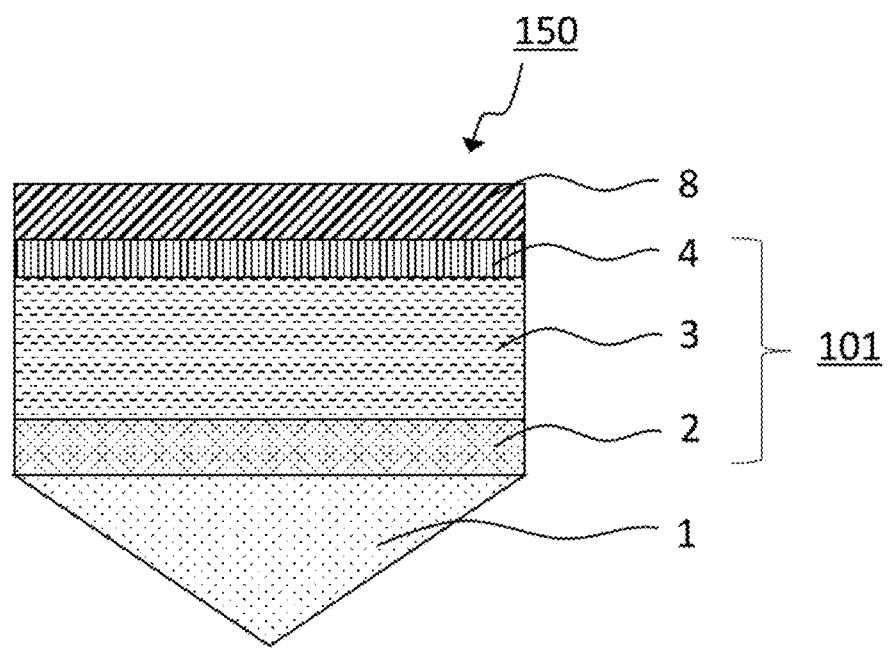
FIG. 7 is a schematic vertical cross-sectional view illustrating Preferable Embodiment 5 of a plasmon resonance intensifying sensor chip.

FIG. 7 illustrates a fifth preferable embodiment (Preferable Embodiment 5) of the intensifying sensor chip. As illustrated in FIG. 7, the intensifying sensor chip may further include a reflective resonance film 8 mainly for the purpose of internally resonating an electric field change due to surface plasmon resonance produced by the plasmon resonance film electrode 4. A preferable embodiment of the intensifying sensor chip includes any of the protection film 7 and the reflective resonance film 8. More specifically, the surface plasmon resonance produced by the plasmon resonance film electrode 4 causes an electric field change inside, and this electric field change propagates and is reflected at the interface opposite to the plasmon resonance film electrode 4, and the reflective resonance film 8 has a function of causing resonance of that electric field change inside the reflective resonance film and thereby amplifying the surface plasmon resonance produced.

Examples of the material of the reflective resonance film 8 include metal oxides (such as titanium dioxide (TiO$_2$), iron (II) oxide (FeO), and iron (III) oxide (Fe$_2$O$_3$); glass such as silicon dioxide (SiO$_2$)), semiconductors other than the metal oxides (such as silicon (Si), germanium (Ge), and a doped product thereof), synthetic resins such as organic substances (such as polyethylene (PE), dimethylpolysiloxane (PDMS), and poly(methyl methacrylate) (PMMA, acrylic resin); and polymers such as cellulose and ethylene glycol), and may be one of these alone or a composite material of two or more kinds. Among them, the material of the reflective resonance film 8 is preferably at least one selected from the group consisting of metal oxides such as TiO$_2$ and SiO$_2$ and semiconductors such as Si, and more preferably at least one selected from the group consisting of metal oxides such as TiO$_2$ and semiconductors such as Si, from the viewpoint that the higher the refractive index of the reflective resonance film 8, the thinner the thickness tends to be.

The thickness of the reflective resonance film 8 is preferably a thickness that satisfies the condition represented by the following formula (1):

$$|\Delta\theta| \leq 2° \quad (1)$$

from the viewpoint of achieving a sufficient improvement in sensor sensitivity.

The $|\Delta\theta|$ in the formula (1) indicates an absolute value (variation in angle) of the difference between the incident angle ($\theta_{Amax}$) at which the current value (A) is the maximum value ($A_{max}$) and the incident angle ($\theta_{min}$) at which the current value is the minimum value ($A_{min}$) in FIG. 2 above.

For example, in the case of measuring the current value when light is incident on the sensor chip within the range where the incident angle ($\theta$) with respect to the surface of the sensor chip in contact with the prism is 0 to 90°, the change in the current value is observed as a peak within the range of $\theta_{cp} \pm 25°$, as illustrated in FIG. 2. Here, the sharpness of the peak, that is, the steep slope of the peak also indicates that the sensor sensitivity is high, and the reflective resonance film 8 provided makes the peak sharper. The $|\Delta\theta|$ indicating the sharpness of the peak is preferably 2° or less as in the above formula (1), more preferably 1.5° or less, and further preferably 1° or less.

Figure 8:
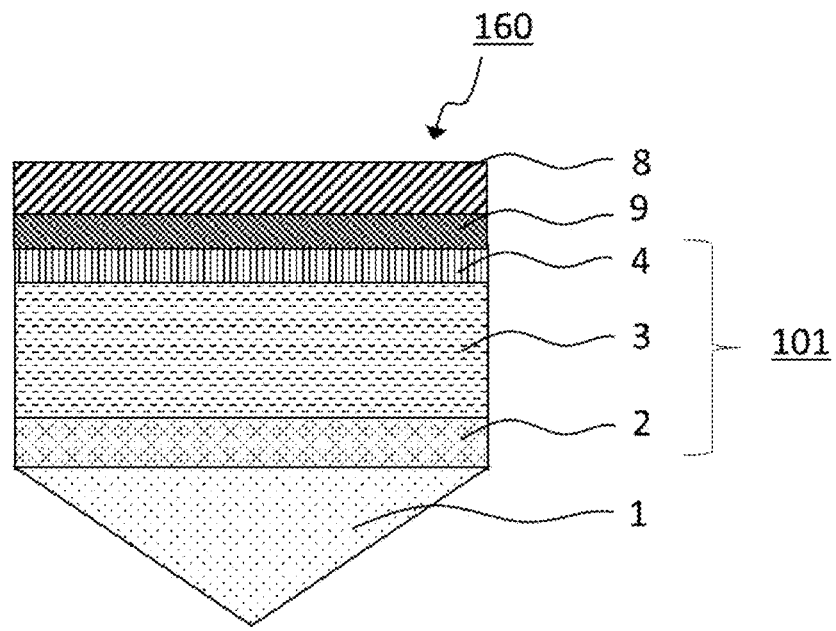
FIG. 8 is a schematic vertical cross-sectional view illustrating Preferable Embodiment 6 of a plasmon resonance intensifying sensor chip.

FIG. 8 illustrates a sixth preferable embodiment (Preferable Embodiment 6) of the intensifying sensor chip. In the intensifying sensor chip, in the case of further including the reflective resonance film 8, an oxide film 9 may be further provided between the plasmon resonance film electrode 4 and the reflective resonance film 8 mainly for the purpose of preventing a decrease in the current value caused by directly stacking the reflective resonance film 8 on the plasmon resonance film electrode 4, as illustrated in FIG. 8 (intensifying sensor chip 160).

Examples of the material of the oxide film 9 include titanium dioxide (TiO$_2$), silicon dioxide (SiO$_2$), chromium oxide (Cr$_2$O$_3$), tin oxide (SnO$_2$), zinc oxide (ZnO), and nickel oxide (NiO), and may be one of these alone or a composite material of two or more kinds. Among them, from the viewpoint of stability as an oxide film, the material of the oxide film 9 is preferably at least one selected from the group consisting of $TiO_2$, $SiO_2$, and $Cr_2O_3$, and more preferably at least one selected from the group consisting of $TiO_2$ and $SiO_2$. In addition, the oxide film 9 may be a single layer containing at least one of these, or may be a plurality of layers formed by stacking two or more such single layers.

In the case of further including the oxide film 9, the thickness is preferably 300 nm or less, more preferably 200 nm or less, further preferably 100 nm or less, and even more preferably 50 nm or less, from the viewpoint that the intensity of surface plasmon resonance produced by the plasmon resonance film electrode 4 tends to decrease as the thickness increases. The lower limit of the thickness of the oxide film 9 is usually 1 nm.

Figure 9:
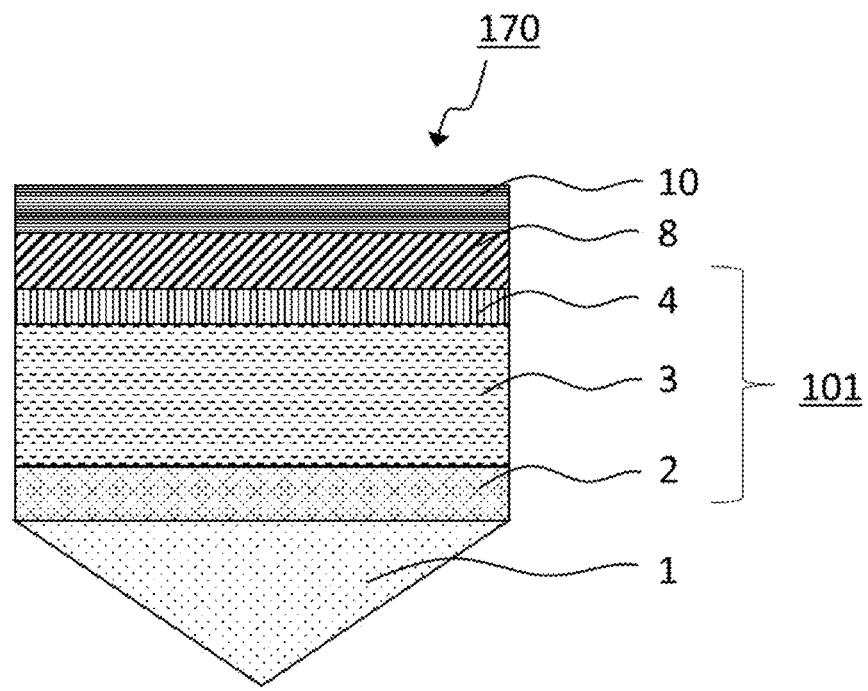
FIG. 9 is a schematic vertical cross-sectional view illustrating Preferable Embodiment 7 of a plasmon resonance intensifying sensor chip.

FIG. 9 illustrates a seventh preferable embodiment of the intensifying sensor chip (Preferable Embodiment 7). In the intensifying sensor chip, in the case of further including the reflective resonance film 8, a molecular bond film 10 may be further provided on the surface of the reflective resonance film 8 opposite to the plasmon resonance film 4 mainly for the purpose of facilitating the binding of biomolecules and the like, as illustrated in FIG. 9 (intensifying sensor chip 170).

Examples of the material of the molecular bond film 10 include gold (Au), silver (Ag), copper (Cu), platinum (Pt), titanium dioxide ($TiO_2$), zirconium oxide ($ZrO_2$), silicon dioxide ($SiO_2$), zinc oxide (ZnO), and aluminum oxide ($Al_2O_3$), and may be one of these alone or a composite material of two or more kinds. Among them, the material of the molecular binding film 10 is preferably at least one selected from the group consisting of Au, Ag, Cu, and Pt from the viewpoint of more efficiently reflecting the electric field change caused by the plasmon resonance film electrode 4 in the reflective resonance film 8, and more preferably at least one selected from the group consisting of Au and Pt from the viewpoint of higher stability when in contact with air or a solution. In addition, the molecular bond film 10 may be a single layer containing at least one of these, or may be a plurality of layers formed by stacking two or more such single layers.

In the case of further including the molecular bond film 10 9, the thickness is preferably 1 to 100 nm, more preferably 1 to 50 nm, and further preferably 1 to 25 nm, from the viewpoint that the intensity of surface plasmon resonance produced by the plasmon resonance film electrode 4 tends to decrease as the thickness increases.

Figure 10:
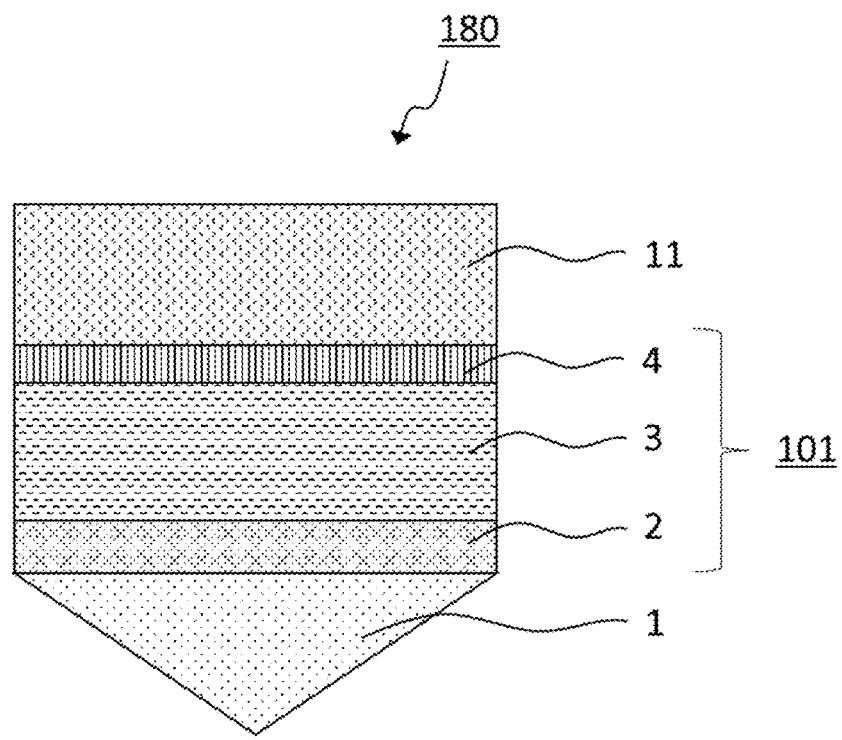
FIG. 10 is a schematic vertical cross-sectional view illustrating Preferable Embodiment 8 of a plasmon resonance intensifying sensor chip.

FIG. 10 illustrates an eighth preferable embodiment (Preferable Embodiment 8) of the intensifying sensor chip. The intensifying sensor chip may further include a sample layer 11 on the surface of the plasmon resonance film electrode 4 opposite to the silicon semiconductor film 3, on the protection film 7 described above, or on the molecular bond film 10 (not illustrated in FIG. 10) mainly for the purpose of holding the sample to be measured (intensifying sensor chip 180). Note that the sample layer 11 may be arranged so that the sample is supplied at a desired flow rate, or may be divided and arranged in a cell shape so that the sample is included in a constant volume.

Additionally, the intensifying sensor chip and the sensor chip are not limited to Embodiments 1 to 8 (the intensifying sensor chips 110 to 180 and the sensor chips 101 to 103) of the intensifying sensor chips described above, and may be any combination thereof (not illustrated) such as those including both of the transparent substrate 5 and the sample chamber 11. Moreover, the intensifying sensor chip may be used singly or two or more thereof may be arranged in the shape of a line or a planar surface.

In the sensor chip constituting the intensifying sensor chip, it is preferable to exhibit a rectifying characteristic between the plasmon resonance film electrode 4 and the electrode 2. As the rectifying characteristic, it suffices that the rectifying characteristic is exhibited at any of between the plasmon resonance film electrode 4 and the electrode 2. When the adhesive layer 6 as the ohmic connecting layer is not provided, it is preferable to exhibit the rectifying characteristic between the silicon semiconductor film 3 and the plasmon resonance film electrode 4 (if an adhesive layer 6 other than the ohmic connecting layer is further provided, the adhesive layer 6). Meanwhile, when the adhesive layer 6 as the ohmic connecting layer is further provided, it is preferable to exhibit the rectifying characteristic between the silicon semiconductor film 3 and the electrode 2. Further, in this case, it is more preferable not to exhibit the rectifying characteristic between the plasmon resonance film electrode 4 and the silicon semiconductor film 3.

Preferably, the combination which forms a Schottky barrier is a combination of the silicon semiconductor film and the plasmon resonance film electrode 4 (if an adhesive layer 6 other than the ohmic connecting layer is further provided, the adhesive layer 6) when the rectifying characteristic is obtained by the Schottky barrier, and is a combination of the silicon semiconductor film 3 and the electrode 2 when the adhesive layer 6 as the ohmic connecting layer is further provided. In addition, the rectifying characteristic may be obtained by the pn junction of the silicon semiconductor film 3, and when the rectifying characteristic is obtained by a pn junction, the silicon semiconductor film 3 is preferably a combination of two or more kinds from n-type semiconductors, p-type semiconductors, and non-doped silicon, and more preferably a combination of n-type semiconductors and p-type semiconductors.

Consider such a setup that the electrode 2 of the sensor chip is connected to the working electrode of a voltage applying means such as a semiconductor analyzer, and the plasmon resonance film electrode 4 is connected to the counter electrode and the reference electrode of the voltage applying means. It is possible to observe that the sensor chip exhibits a rectifying characteristic by measuring a current value when a voltage in a range of −1.5 to +1.5 V is applied to the working electrode. Regarding the current value, the maximum value of the absolute value of the current value at 0 V or more and +1.5 V or less is preferably one fifth or less, more preferably one tenth, and further preferably one twentieth of the maximum value of the absolute value of the current value at −1.5 V or more and less than 0 V. The rectifying characteristics are attenuated when this ratio exceeds the upper limit value, and therefore the noise at the time of measurement tends to increase and the sensitivity and accuracy of the sensor tend to decrease.

In addition, the combination which forms a Schottky barrier between the silicon semiconductor film 3 and the plasmon resonance film electrode 4 is a combination which satisfies the condition represented by the formula: $\varphi S<\varphi M$, where the work function of the silicon semiconductor film 3 is denoted by $\varphi S$, and the work function of the plasmon resonance film electrode 4 (or the adhesive layer 6) is denoted by $\varphi M$.

Moreover, the combination which forms a Schottky barrier between the silicon semiconductor film 3 and the electrode 2 is a combination which satisfies the condition represented by the formula: $\varphi S<\varphi M$, where the work function of the silicon semiconductor film 3 is denoted by φS, and the work function of the electrode 2 is denoted by φM.

The values of the work function for various materials are known, and for example, (I) I-589 of "Handbook of Chemistry: Pure Chemistry, 4th Edition" edited by the Chemical Society of Japan states that the work function of silicon (φS) is 4.8. Note that, since the work function (φS) increases or decreases depending on the doping type and the doping amount in silicon, it is possible to obtain a desired work function (φS) in the silicon semiconductor film 3 by adjusting these. In addition, for example, as the work function of the plasmon resonance film electrode 4 (or the adhesive layer 6) (φM), (II) II-489 of "Handbook of Chemistry: Pure Chemistry, 4th Edition" edited by the Chemical Society of Japan states that gold (Au): 5.1 to 5.47, silver (Ag): 4.26 to 4.74, aluminum (Al): 4.06 to 4.41, copper (Cu): 4.48 to 4.94, platinum (Pt): 5.64 to 5.93, palladium (Pd): 5.55, zinc (Zn): 3.63, and chromium (Cr): 4.5. Additionally, (III) Takashi Matsukawa et al., Jpn. J. Appl. Phys., 2014, 53, 04EC11 states that titanium nitride (TiN): 4.4 to 4.6. Moreover, page 195 of "Transparent Conductive Films, Volume 2" from CMC Technical Library 273 supervised by Yutaka Sawada states that transparent conductive materials such as ITO, FTO, and metal oxides such as ZnO doped with other elements (such as aluminum and gallium) are approximately 4.5 to 5.5.

Therefore, it is possible to select and appropriately employ a combination satisfying the above conditions from those work functions (φS and φM) as the combination of the silicon semiconductor film 3 with the plasmon resonance film electrode 4 (or with the adhesive layer 6) or the combination of the silicon semiconductor film 3 with the electrode 2 which forms a Schottky barrier.

Moreover, the combination which forms the pn junction described above is a combination of an n-type semiconductor and a p-type semiconductor, which is determined by the element to be doped. In the case of silicon, the formation of an n-type semiconductor involves doping with phosphorus (P), antimony (Sb), and arsenic (As), and the formation of a p-type semiconductor involves doping with boron (B), aluminum (Al), and gallium (Ga). Doping with one or more from each group is preferable. From the viewpoint of widespread use and inexpensiveness, it is more preferable to dope with phosphorus or antimony for n-type semiconductors and boron or aluminum for p-type semiconductors, and it is more preferable to dope with phosphorus for n-type semiconductors and boron for p-type semiconductors.

(Electric Measuring Apparatus (Electric Measuring Apparatus))

The sensor of the present disclosure includes the intensifying sensor chip (for example, the intensifying sensor chip 110 in Preferable Embodiment 1) provided with the prism 1 and the sensor chip (for example, the sensor chip 101 in Preferable Embodiment 1) and the electric measuring apparatus (for example, the electric measuring apparatus 21 in Preferable Embodiment 1) which directly measures the current or voltage from the electrode 2 and the plasmon resonance film electrode 4 of the sensor chip. The electrode 2 and the plasmon resonance film electrode 4 are preferably electrically connected to the electric measuring apparatus via external circuits (for example, external circuits 31 and 31' in Preferable Embodiment 1). The material of the external circuits is not particularly limited, and it is possible to use a known one as the material of conductive wire. Examples thereof include metals such as platinum, gold, palladium, iron, copper, and aluminum. Also, the electric measuring apparatus is not particularly limited as long as it can measure the voltage value or the current value, and examples thereof include semiconductor device analyzers, current measuring devices, and voltage measuring devices.

In the sensor of the present disclosure, light is emitted onto the prism 1, and the light (incident light) having passed through the prism 1, the electrode 2, and the silicon semiconductor film 3 totally reflects between the plasmon resonance film electrode 4 and the silicon semiconductor film 3, interacting with the plasmon resonance film electrode 4 to produce surface plasmon resonance. More specifically, the light having passed through the silicon semiconductor film 3 (note that part thereof is absorbed by the silicon semiconductor film 3) totally reflects at the interface between the silicon semiconductor film 3 and the plasmon resonance film electrode 4 or, if provided with an adhesive layer, the interface between plasmon resonance film electrode 4 and the adhesive layer or the interface between the adhesive layer and the silicon semiconductor film 3, or, if provided with two or more adhesive layers, the interface between the plasmon resonance film electrode 4 and the adhesive layer, the interface between the adhesive layer and the silicon semiconductor film. 3, or the interface between the two adjacent adhesive layers. Evanescent waves produced by the total reflection interact with the plasmon resonance film electrode 4 to produce surface plasmon resonance. In addition, hot electrons are produced inside the silicon semiconductor film 3 by the light (incident light) having passed through the prism 1 and the electrode 2, and the light (reflected light) reflected by the plasmon resonance film electrode 4.

The surface plasmon resonance produced sufficiently polarizes the plasmon resonance film electrode 4 to produce hot electrons, and the hot electrons transfer to the silicon semiconductor film 3 and are picked up as an electric signal from the electrode 2 together with the hot electrons generated in the silicon semiconductor film 3. Here, the electrode 2 is electrically connected to the plasmon resonance film electrode 4 via the external circuits, and the electric measuring apparatus can measure the current change between the electrode 2 and the plasmon resonance film electrode 4 to detect the change in surface plasmon resonance. The hot electrons observed as an electric signal as described above are considered to be hot electrons produced in the silicon semiconductor film 3 and the hot electrons produced in the vicinity of the interface inside the plasmon resonance film electrode 4, as described above. In addition, when a sample as the measurement target is placed in the vicinity of the plasmon resonance film electrode 4 (preferably within 300 nm from the surface of the plasmon resonance film electrode 4), it is possible to detect as an electric signal the change in surface plasmon resonance due to the change in refractive index of the sample (concentration change and state change). Thus, measurement of the electric signal makes it possible to monitor the state change of the sample.

When the wavelength of the light entering the prism 1 is increased, the range of the incident angle of the incident light for producing surface plasmon resonance becomes smaller, whereas the strength of the surface plasmon resonance (especially surface plasmon polaritons) produced is intensified. Thus, although not particularly limited depending on the purpose, the light allowed to enter the prism 1 (light entering the prism 1) is, for example, light in the wavelength region of visible light or light in the wavelength region of near infrared light, and has a wavelength of preferably 400 to 1500 nm, a wavelength of more preferably 500 to 1000 nm, and a wavelength of further preferably 600 to 900 nm. In addition, in order to produce hot electrons by light absorption in the silicon semiconductor film 3, the light incident on the prism 1 is preferably of a wavelength that can be absorbed by the silicon semiconductor film 3, and the wavelength is preferably 400 to 700 nm.

Additionally, when the intensity of the light entering the prism 1 becomes strong, the amount of current produced by the surface plasmon resonance increases. Thus, although not particularly limited depending on the purpose, the intensity of the light allowed to enter the prism 1 is preferably 0.01 to 500 mW, more preferably 0.1 to 50 mW, and further preferably 0.1 to 5 mW. When the intensity of light is less than the lower limit, the amount of current produced by the surface plasmon resonance tends to be too small, making it impossible to obtain a sufficient sensor accuracy. On the other hand, when the intensity of light exceeds the upper limit, there is a tendency that heat is produced in the plasmon resonance film electrode 4, which may decrease the measurement sensitivity.

Figure 11:
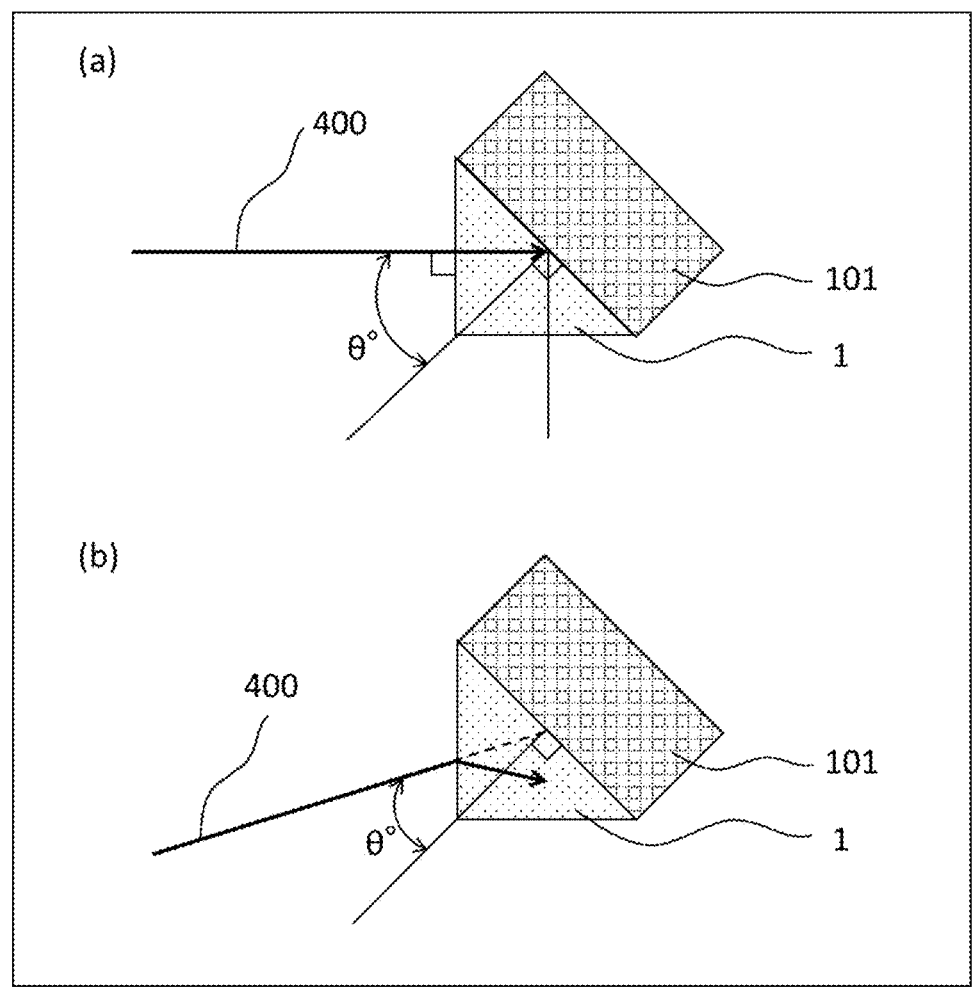
FIG. 11 is a schematic view illustrating an incident angle (θ°) of light entering the prism.

In the sensor of the present disclosure, it is possible to further sufficiently improve the sensor accuracy by changing the incident angle of the light entering the prism 1 depending on the sample to be measured. Note that, for example, the light entering the prism 1 travels in a straight line (incident light 400) when perpendicularly entering the surface of the prism 1 as illustrated in FIG. 11(*a*), but is refracted (incident light 400) by the prism 1 when entering the surface at an angle other than the right angle as illustrated in FIG. 11(*b*). Thus, in the present specification, the incident angle ($\theta°$) of the light entering the prism is defined as the incident angle to the surface of the photoelectric conversion unit (sensor chip 101 in FIG. 11) in contact with the prism 1, as illustrated in FIGS. 11(*a*) and 11(*b*). The same applies to the case where the light source of the incident light is inside the prism.

As to the sample containing the target substance and medium held on the surface of the plasmon resonance film electrode 4 opposite to the silicon semiconductor film 3, on the protection film 7, on the molecular bond film 10, or preferably inside the sample chamber 11, the sensor can detect as an electric signal the change in surface plasmon resonance due to the concentration change and state change of the target substance. In this case, the target substance is not particularly limited, and examples thereof include small molecule compounds such as antibodies, nucleic acids (DNA, RNA, and the like), proteins, bacteria, and drugs; ions; and small molecule compounds in gaseous state and volatile substances. In addition, examples of the medium include solutions and gases, examples of the solutions include water; buffer solutions and electrolyte solutions such as strong electrolyte solutions, and examples of the gases include inert gases such as nitrogen gas and helium gas.

Although not particularly limited, the method for manufacturing the sensor of the present disclosure as well as the intensifying sensor chip including the prism 1 and the sensor chip is preferably a method for sequentially forming and stacking on the prism 1 the electrode 2, the silicon semiconductor film 3, and the plasmon resonance film electrode film 4 in this order. Although the formation method is not particularly limited, examples of the method for forming the electrode 2, the silicon semiconductor film 3, and the plasmon resonance film electrode film 4 include each independently the sputtering method, the ion plating method, the electron beam vapor deposition method, the atomic layer volume method, the vacuum vapor deposition method, the chemical vapor deposition method, and the plating method. When the intensifying sensor chip further includes additional layers, each of these layers can be appropriately formed by a conventionally known method or a method similar thereto. Additionally, in the method for manufacturing a sensor, no limitation is imposed on the method for electrically connecting the electrode 2 and the plasmon resonance film electrode 4 of the sensor chip to the electric measuring apparatus via external circuits, and the connection is possible by appropriately employing a conventionally known method.

EXAMPLES

Hereinafter, the examples and comparative examples are described more specifically, but the present invention is not limited to the following examples.

Example 1

Prepared was a substrate including a film (silicon film, resistance value <50Ω, thickness: 100 nm, dopant: phosphorus, manufactured by Kyodo International Inc.) made of a silicon semiconductor (n-type semiconductor) formed on the ITO (indium tin oxide) film of an ITO substrate having an electrode made of ITO film formed on one surface of a glass substrate (glass substrate: S-TIH11, thickness of the glass substrate: 1.1 mm, area: 19.6×19.6 mm, ITO film: highly durable transparent conductive film of 5Ω, manufactured by GEOMATEC Co., Ltd.). Next, a sputtering apparatus (QAM-4, manufactured by ULVAC, Inc.) was used to form a film made of Au (Au film) having a thickness of 50 nm on the silicon film and using Au (99.99%, manufactured by Kojundo Chemical Laboratory Co., Ltd.) as the target to obtain a chip formed by stacking the glass substrate, the ITO film, the silicon film, and the Au film in this order (photoelectric conversion unit (sensor chip)).

Next, diiodomethane (first grade, manufactured by FUJI-FILM Wako Pure Chemical Corporation) was applied on the surface of the obtained chip opposite to the ITO film of the glass substrate, and the slope of the right-angle prism (S-TIH11, manufactured by Tokiwa Optical Corporation, refractive index: 1.77) was brought into close contact to obtain a chip (prism-attached chip) formed by stacking the prism, diiodomethane, the glass substrate, the ITO film, the silicon film, and the Au film in this order.

Comparative Example 1

First, on the ITO film of the ITO substrate same as that of Example 1, the sputtering apparatus was used to form a film made of $TiO_2$ ($TiO_2$ film) having a thickness of 200 nm by use of $TiO_2$ (Titanium Dioxide, 99.9%, manufactured by Furuuchi Chemical Corporation) as the target. A chip (prism-attached chip) formed by stacking the prism, diiodomethane, the glass substrate, the ITO film, the $TiO_2$ film, and the Au film in this order was obtained in the same manner as in Example 1 except that this film was used in place of the ITO substrate and the silicon film.

Test Example 1

Figure 12:
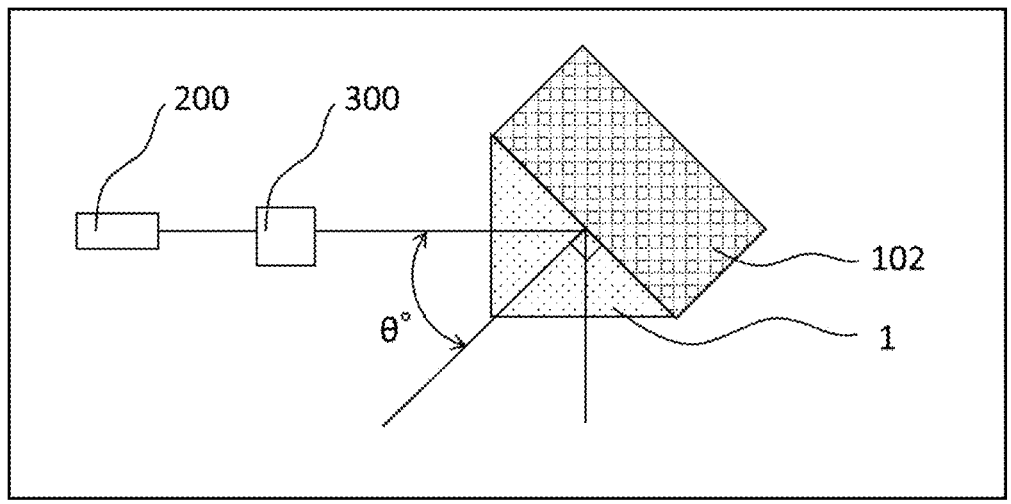
FIG. 12 is a schematic diagram illustrating a current measuring method of Test Example 1.

Electrical connection was established with conductive wire between the ITO film of each of the prism-attached chips obtained in Example 1 and Comparative Example 1 and the working electrode of a current measuring device (Electrochemical Analyzer Model 802D, manufactured by ALS/CH Instruments Inc.) and between the Au film and the counter electrode of the current measuring device. Next, laser light of 670 nm (light source: CPS670F, manufactured by Thorlabs, Inc.) was allowed to pass through a polarizer (CMM1-PBS251/M, manufactured by Thorlabs, Inc.) for conversion into p-polarized laser light, and its intensity was measured with a power meter (Model 843-R, manufactured by Newport Corporation) for adjustment to 4.0 mW. As illustrated in FIG. 12, this was used as incident light and allowed to enter the prism (prism 1) of each sensor chip (sensor chip 102) so that the angle of incidence (θ, Angle (degrees)) with respect to the surface of the glass substrate was 20 to 40°, and the current value (Current (μA)) between the ITO film and the Au film (plasmon resonance film electrode) was measured. The obtained results are illustrated in FIG. 13.

Figure 13:
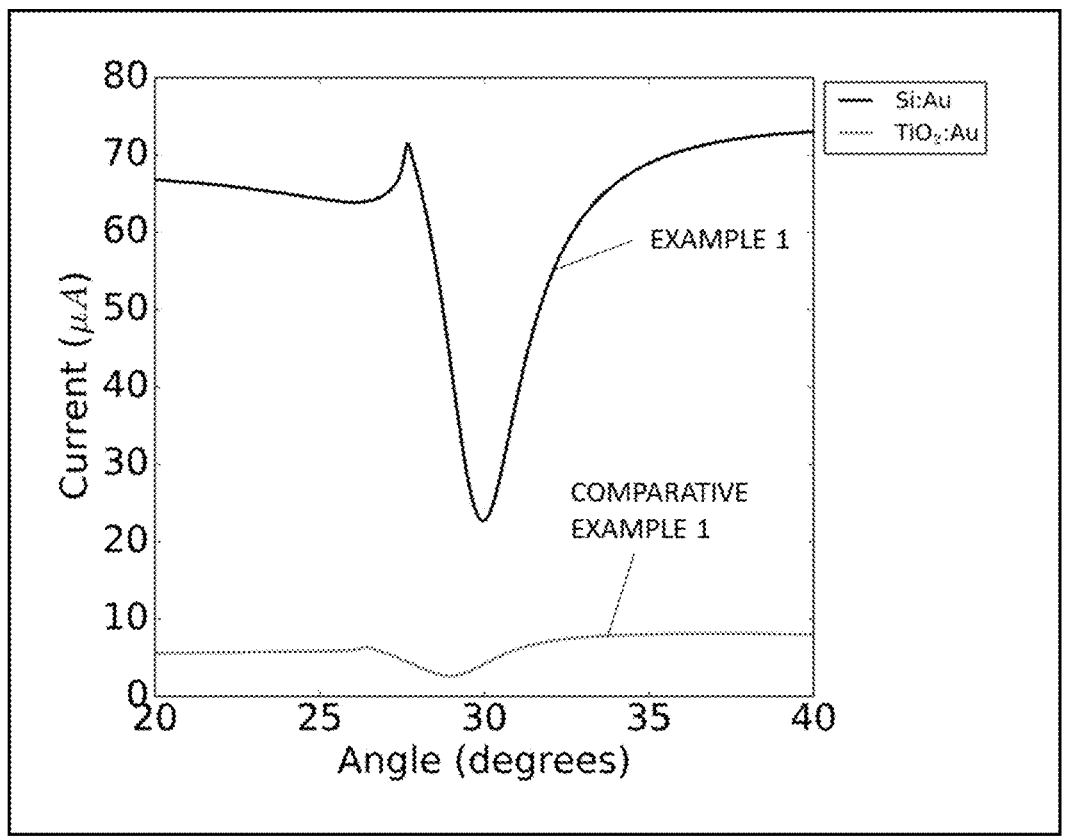
FIG. 13 is a graph illustrating the relationship between the incident angle and the current value obtained by carrying out Test Example 1 on the prism-attached chips obtained in Example 1 and Comparative Example 1.

As is apparent from the results illustrated in FIG. 13, when a silicon film was used as the semiconductor film (for example, Example 1), a current value about 10 times larger than that in the case of using a $TiO_2$ film (for example, Comparative Example 1) was obtained. Also, when a silicon film was used as the semiconductor film (for example, Example 1), a change in current value dependent on the light incident angle, which is characteristic when surface plasmon resonance occurs, was observed as illustrated in FIG. 2, and it was confirmed that plasmon resonance occurred. Moreover, it was confirmed that the variation of this current value (ΔI) was significantly large, and that the electric signal was detectable with particularly high sensitivity depending on the light incident angle.

Test Example 2

The chip obtained in Example 1 was confirmed to function as a sensor chip. Specifically, first, a sample chamber was placed to come into contact with the surface of the Au film of the prism-attached chip obtained in Example 1 (the surface opposite to the silicon film), and the sample chamber was filled with ultrapure water. In addition, in the same manner as that of Test Example 1, electrical connection was established with conductive wire between the ITO film of the prism-attached chip obtained in Example 1 and the working electrode of the current measuring device and between the Au film and the counter electrode and the reference electrode of the current measuring device.

Figure 14:
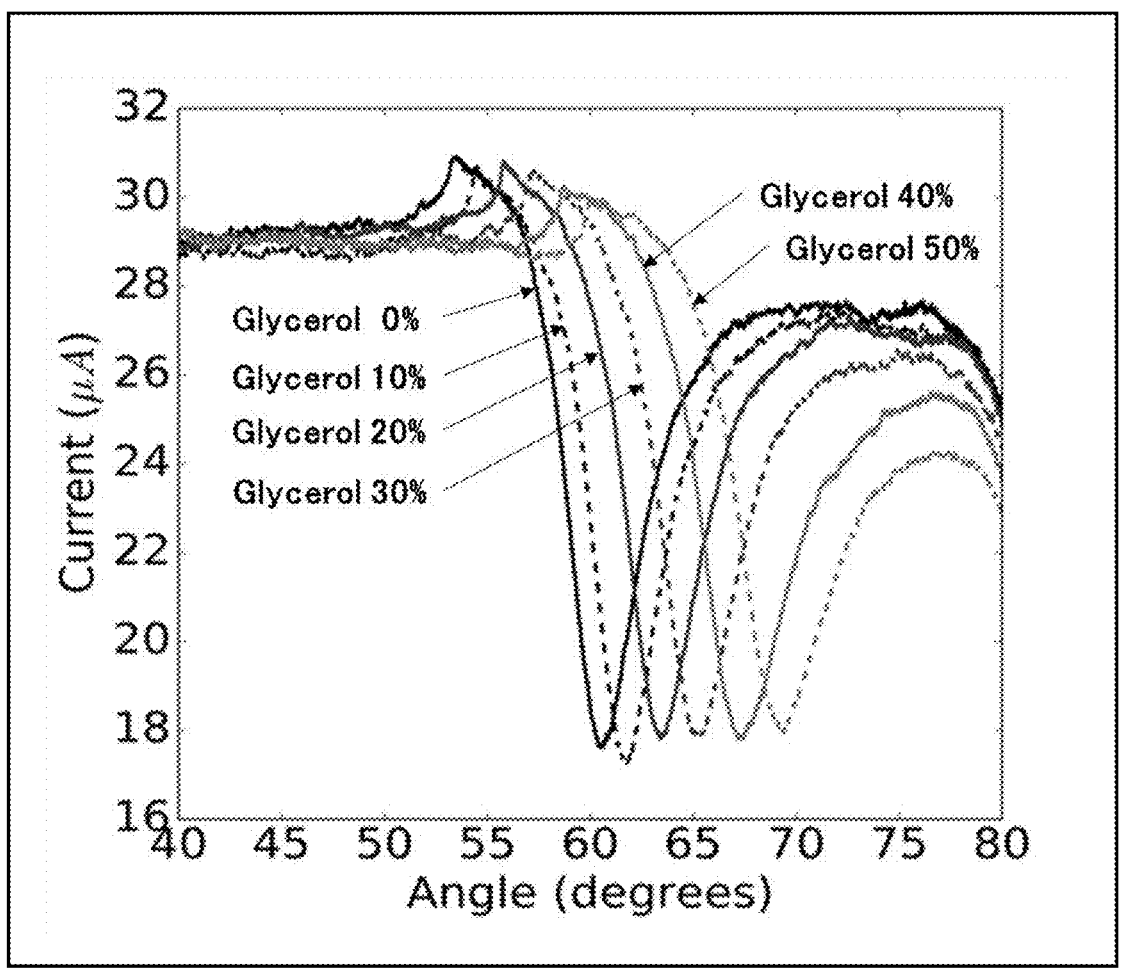
FIG. 14 is a graph illustrating the relationship between the incident angle and the current value for the solutions obtained by carrying out Test Example 2 on the prism-attached chip obtained in Example 1.

Next, in in the same manner as that of Test Example 1, the p-polarized laser light was emitted onto the prism of the sensor chip. The incident angle (θ°) of the p-polarized laser light (incident light) to the glass substrate surface was changed between 40° to 80° to measure the current value (Current (μA)) between the ITO film and the Au film for various incident angles. In addition, the current value between the ITO film and the Au film for various incident angles was measured in the same manner as above except that the solution used was the following glycerol at concentrations of 10 to 50% instead of the ultrapure water. FIG. 14 illustrates the results (graph illustrating the relationship between the incident angle (θ, Angle (degrees)) for various solutions and the current value (Current (μA)) between the ITO film and the Au film). In addition, Table 2 presents the refractive index of various solutions at 22.0° C.

TABLE 2

| | Refractive Index of Solution (22.0° C.) |
|---|---|
| Ultrapure Water | 1.3328 |
| 10% Glycerol | 1.3456 |
| 20% Glycerol | 1.3609 |
| 30% Glycerol | 1.3751 |

TABLE 2-continued

| | Refractive Index of Solution (22.0° C.) |
|---|---|
| 40% Glycerol | 1.3923 |
| 50% Glycerol | 1.4062 |

As is apparent from the results illustrated in FIG. 14, in the intensifying sensor chip including a prism and a sensor chip (for example, Example 1), the amount of change in current value was confirmed to increase particularly when the incident angle (θ°) of the light entering the prism was between 50 to 75° if the solution was in contact with the Au film. Note that in FIG. 14, the incident angle (θ°) at which a change in current value is observed is different from that in Test Example 1 (FIG. 13). The present inventors presume that this is because the incident angle for producing the surface plasmon resonance changed when the aqueous solution was brought into contact with the Au film surface. Moreover, as illustrated in Table 2 and FIG. 14, the current value was confirmed to change depending on the refractive index of the solution. The present inventors presume the reason as follows. While the amount of current produced by light absorption inside the silicon film and the amount of current produced due to the change in electric field in the Au film placed in the vicinity of the silicon film changed due to the surface plasmon resonance produced by the total reflection of the incident light caused by use of the prism at the interface between the silicon film and the Au film, the intensity of the surface plasmon resonance which caused this change was changed depending on the refractive index of the solution. As a result, the amount of current was changed. Therefore, it was confirmed that use of the intensifying sensor chip of the present disclosure made it possible to measure with sufficient accuracy the change in refractive index of the sample in the vicinity of the Au film. Since the refractive index generally corresponds to the concentration or state of the sample having the refractive index, it was confirmed that the sensor chip of the present disclosure and the sensor using the sensor chip and a prism in combination had sufficient accuracy as a sensor chip and a sensor capable of measuring the concentration change and state change of the sample.

Test Example 3

Figure 15:
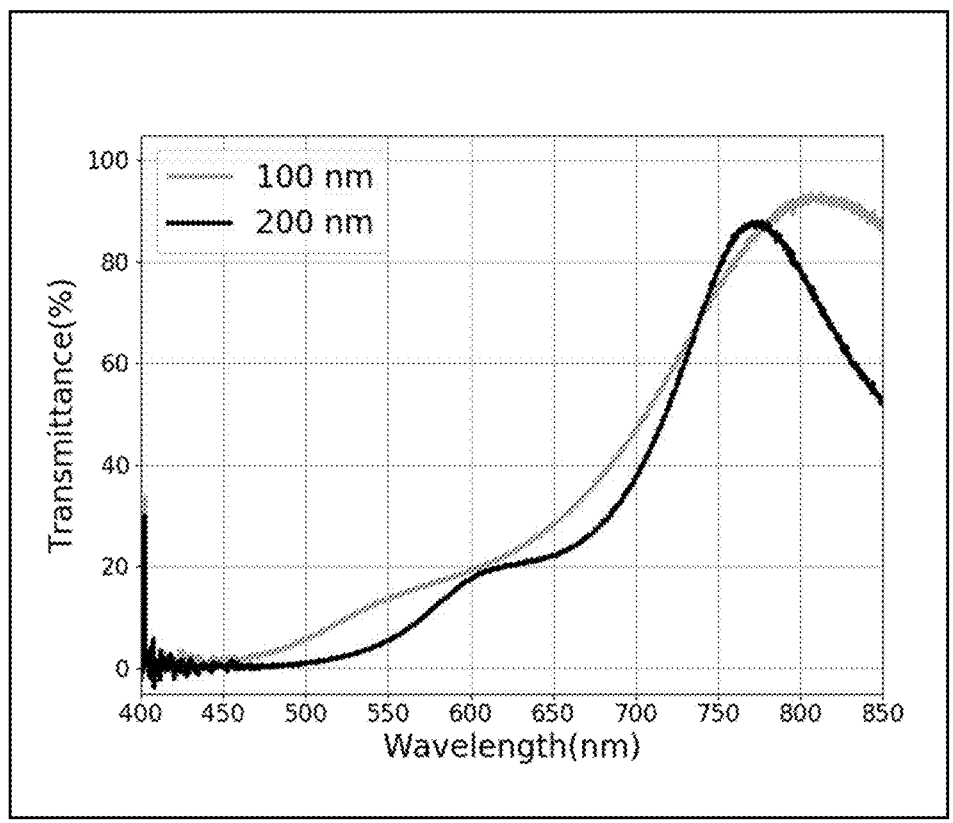
FIG. 15 is a graph illustrating the results of light transmittance obtained by carrying out Test Example 3 on a silicon film similar to the silicon film used in Example 1.

A silicon film same as the silicon film in Example 1 above was prepared, and its light transmittance was measured. First, a sputtering apparatus (QAM-4, manufactured by ULVAC, Inc.) was used to obtain a silicon film (thickness 100 nm or 200 nm) for measuring light transmittance on a glass substrate (S-TIH11, thickness of the glass substrate: 1.1 mm, area: 19.6×19.6 mm) by use of n-type silicon (99.999% Si (N-type P-doped), resistance value 50-500 Ω·cm, manufactured by Kojundo Chemical Laboratory Co., Ltd.) as a target. Then, a measuring device (USB2000+, manufactured by Ocean Optics, Inc.) was used to emit light from the start wavelength to the end wavelength onto one surface of each silicon film under the conditions of integration time: 365 msec, average number of times: 5 times, start wavelength: 339.523 nm, and end wavelength: 1028.662 nm, to thereby measure the light transmittance (Transmittance (%)) at each wavelength. FIG. 15 illustrates the obtained results (thickness of silicon film: 100 nm, 200 nm). In addition, Table 3 below presents the light transmittance (%) when the emitted light has a wavelength of 675 nm.

TABLE 3

| Thickness of Silicon Film | Light Transmittance at Wavelength of 675 nm (%) |
| --- | --- |
| 100 nm | 36 |
| 200 nm | 27 |

Example 2

A chip (prism-attached chip) formed by stacking a prism, diiodomethane, a glass substrate, an ITO film, a non-doped silicon film, and an Au film in this order was obtained in the same manner as in Comparative Example 1 except that non-doped silicon (99.999% Si, manufactured by Kojundo Chemical Laboratory Co., Ltd.) was used as a target in place of the $TiO_2$, and a film (non-doped silicon film) having a thickness of 200 nm made of pure silicon was formed on the ITO film.

Figure 16:
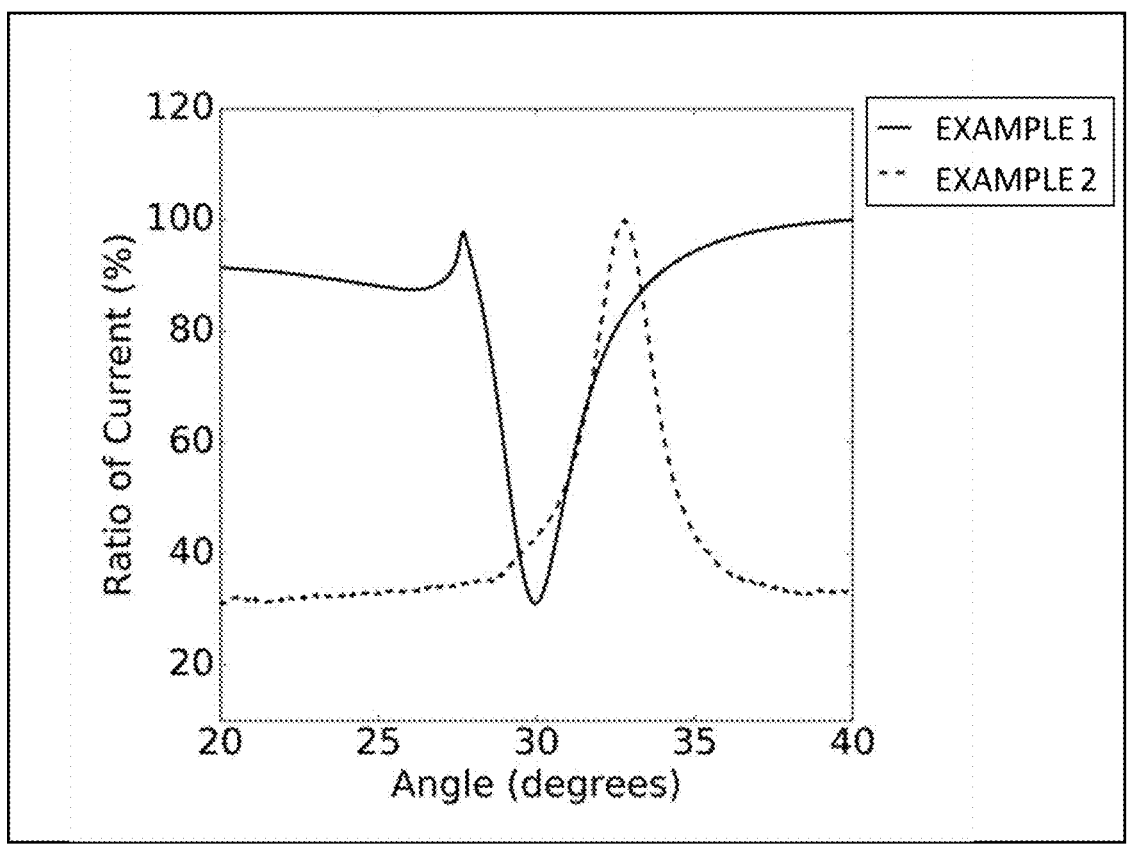
FIG. 16 is a graph illustrating the relationship between the incident angle and the current value obtained by carrying out Test Example 1 on the prism-attached chip obtained in Example 2.

The current value (Current (μA)) between the ITO film and the Au film (plasmon resonance film electrode) was measured in the same manner as in Test Example 1 except that the prism-attached chip obtained in Example 2 was used instead of the prism-attached chip obtained in Example 1. FIG. 16 illustrates the obtained results. Note that FIG. 16 illustrates the ratio of each current value (Ratio of Current (%)) to the maximum value of the measured current value, where the maximum value is set to 100%. In addition, at the same time, as a reference, the ratio of the measured current value to the maximum value is also presented for the current value between the ITO film and the Au film (plasmon resonance film electrode) measured using the prism-attached chip obtained in Example 1.

As is apparent from the results illustrated in FIG. 16, even in the case of using a non-doped silicon film as the semiconductor film (Example 2), a change in current value dependent on the light incident angle, which is characteristic when surface plasmon resonance occurs, was observed, and it was confirmed that plasmon resonance occurred. Note that, in the case of using non-doped silicon, the current value dependent on the light incident angle changed in the increasing direction contrary to the case of Example 1, but it can be used for a biosensor even if the increase and decrease of the current value is reversed.

Example 3

First, the same ITO substrate as in Example 1 was prepared, and the sputtering apparatus was used to form a film (silicon film) having a thickness of 100 nm made of Si on the ITO substrate by use of n-type silicon (99.999% Si (N-type P-doped), resistance value 50-500 Ω·cm, manufactured by Kojundo Chemical Laboratory Co., Ltd.) as a target. Next, Ti (99.99%, manufactured by Toshima Manufacturing Co., Ltd.) was used to form a film (Ti film) having a thickness of 10 nm made of Ti on the silicon film. Next, the sputtering apparatus was used to form a film (Au film) having a thickness of 50 nm made of Au on the Ti film by use of Au (99.99%, manufactured by Kojundo Chemical Laboratory Co., Ltd.) as a target to obtain a chip (photoelectric conversion unit (sensor chip)) formed by stacking the glass substrate, the ITO film, the silicon film, the Ti film, and the Au film in this order.

Next, diiodomethane (first grade, manufactured by FUJIFILM Wako Pure Chemical Corporation) was applied on the surface of the obtained chip opposite to the ITO film of the glass substrate, and the slope of the right-angle prism (S-TIH11, manufactured by Tokiwa Optical Corporation, refractive index: 1.77) was brought into close contact to obtain a chip (prism-attached chip) formed by stacking the prism, diiodomethane, the glass substrate, the ITO film, the silicon film, the Ti film, and the Au film in this order.

Figure 17:
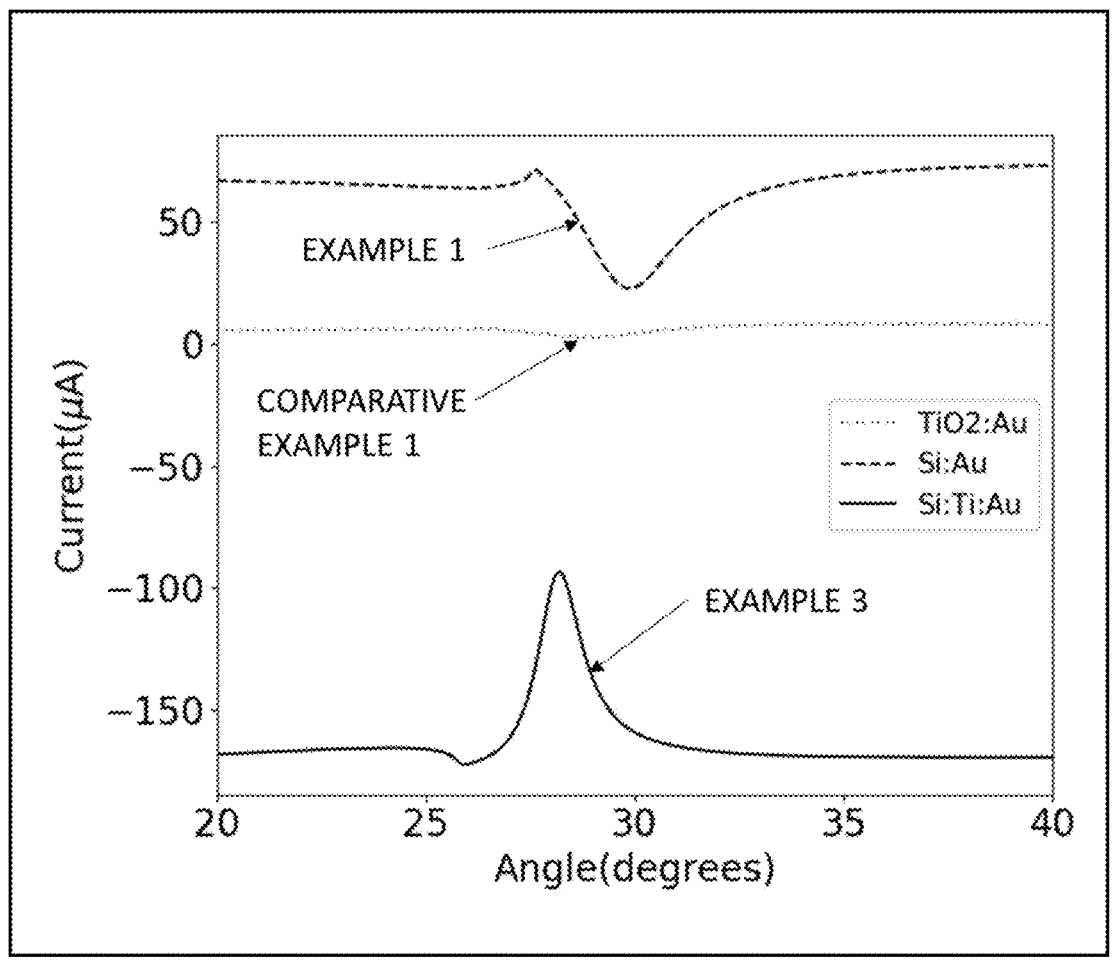
FIG. 17 is a graph illustrating the relationship between the incident angle and the current value obtained by carrying out Test Example 1 on the prism-attached chips obtained in Examples 1 and 3 and Comparative Example 1.

The current value (Current (pA)) between the ITO film and the Au film was measured in the same manner as in Test Example 1 except that the prism-attached chip obtained in Example 3 was used instead of the prism-attached chip obtained in Example 1. FIG. 17 illustrates the obtained results. FIG. 17 also illustrates the result of using the prism-attached chip obtained in Example 1 and the result of using the prism-attached chip obtained in Comparative Example 1. In addition, Table 4 below presents the current values (μA) when the incident angle is 20°.

TABLE 4

| | Current Value (20°, μA) |
| --- | --- |
| Comparative Example 1 | 5.5 |
| Example 1 | 66.8 |
| Example 3 | −168.3 |

As is apparent from the results presented in FIG. 17 and Table 4, it was confirmed that the variation of the current value (absolute value) was further increased when the adhesive layer (Ti film) was further provided (Example 3). Note that, in the case of further including the adhesive layer (Ti film), the current value dependent on the light incident angle changed in the increasing direction contrary to the case of Example 1, but it can be used for a biosensor even if the increase and decrease of the current value is reversed.

INDUSTRIAL APPLICABILITY

As described above, the electricity measuring type surface plasmon resonance sensor and the sensor chip used therefore of the present disclosure make it possible to provide an electricity measuring type surface plasmon resonance sensor having higher sensor sensitivity than that of conventional ones and a sensor chip used therefor. In addition, since the sensor and the sensor chip of the present disclosure can detect surface plasmon resonance as an electric signal, downsizing and high throughput can be easily achieved. Further, the sensor and the sensor chip of the present disclosure do not affect the sample, so that more accurate measurement is possible. Therefore, the sensor and sensor chips of the present disclosure are very useful in the future development of medical care, foods, and environmental technologies.

REFERENCE SIGNS LIST

1: prism
2: electrode
3: silicon semiconductor film
4: plasmon resonance film electrode
5: transparent substrate
6: adhesive layer
7: protection film
8: reflective resonance film
9: oxide film
10: molecular bond film
11: sample chamber
101, 102, 103: sensor chip (photoelectric conversion unit)
21: electric measuring apparatus 31, 31': external circuit
110: intensifying sensor chip (Embodiment 1)
120: intensifying sensor chip (Embodiment 2)
130: intensifying sensor chip (Embodiment 3)
140: intensifying sensor chip (Embodiment 4)
150: intensifying sensor chip (Embodiment 5)
160: intensifying sensor chip (Embodiment 6)
170: intensifying sensor chip (Embodiment 7)
180: intensifying sensor chip (Embodiment 8)
200: light source
300: polarizer
400: incident light
510: sensor (Embodiment 1)

The invention claimed is:

1. An electricity measuring type surface plasmon resonance sensor comprising:
   a plasmon resonance intensifying sensor chip in which a prism and a sensor chip are arranged, the sensor chip including an electrode, a silicon semiconductor film, and a plasmon resonance film electrode arranged in this order, wherein the prism, the electrode, the silicon semiconductor film, and the plasmon resonance film electrode are arranged in this order; and
   an electric measuring apparatus which directly measures a current or voltage from the electrode and the plasmon resonance film electrode,
   wherein the prism is configured to control an angle of an incident light so as to allow the incident light to totally reflect between the plasmon resonance film electrode and the silicon semiconductor film, and
   wherein the electrode picks up an electric signal of hot electrons emitted in association with a surface plasmon resonance produced in the plasmon resonance film electrode and moved through the silicon semiconductor film.

2. The electricity measuring type surface plasmon resonance sensor according to claim 1, wherein in the sensor chip, a thickness of the plasmon resonance film electrode is 200 nm or less, not including 0.

3. The electricity measuring type surface plasmon resonance sensor according to claim 1, wherein the sensor chip exhibits a rectifying characteristic between the plasmon resonance film electrode and the electrode.

4. The electricity measuring type surface plasmon resonance sensor according to claim 3, wherein a combination of the plasmon resonance film electrode and the silicon semiconductor film is a combination which forms a Schottky barrier.

5. The electricity measuring type surface plasmon resonance sensor according to claim 3, wherein in the sensor chip, the silicon semiconductor film includes a pn junction formed therein.

6. The electricity measuring type surface plasmon resonance sensor according to claim 1, wherein the sensor chip further includes an adhesive layer between the silicon semiconductor film and the plasmon resonance film electrode.

7. The electricity measuring type surface plasmon resonance sensor according to claim 6, wherein the sensor chip exhibits a rectifying characteristic between the silicon semiconductor film and the electrode.

8. The electricity measuring type surface plasmon resonance sensor according to claim 7, wherein the sensor chip exhibits a rectifying characteristic due to the Schottky barrier at an interface between the silicon semiconductor film and the electrode.

9. The electricity measuring type surface plasmon resonance sensor according to claim 1, wherein a light transmittance of the silicon semiconductor film at a wavelength of 400 to 700 nm is 1 to 70%.

10. A method for detecting surface plasmon resonance changes using an electricity measuring type surface plasmon resonance sensor including:
    a plasmon resonance intensifying sensor chip in which a prism and a sensor chip are arranged, the sensor chip including an electrode, a silicon semiconductor film, and a plasmon resonance film electrode arranged in this order, wherein the prism, the electrode, the silicon semiconductor film, and the plasmon resonance film electrode are arranged in this order, and
    an electric measuring apparatus which directly measures a current or voltage from the electrode and the plasmon resonance film electrode, wherein the prism is configured to control an angle of an incident light so as to allow the incident light to totally reflect between the plasmon resonance film electrode and the silicon semiconductor film,
    the method for detecting surface plasmon resonance changes comprising:
    producing surface plasmon resonance by emitting light onto the prism and allowing the light, passing through the prism, the electrode, and the silicon semiconductor film, to totally reflect between the plasmon resonance film electrode and the silicon semiconductor film to interact with the plasmon resonance film electrode, and producing hot electrons by subjecting the light having passed through the prism and the electrode and the totally reflected light to light absorption in the silicon semiconductor film;
    picking up hot electrons produced by light absorption in the silicon semiconductor film, and hot electrons produced by the surface plasmon resonance and moved through the silicon semiconductor film, as an electric signal from the electrode; and
    measuring a change in current or voltage between the electrode and the plasmon resonance film electrode with the electric measuring apparatus.

11. The method for detecting surface plasmon resonance changes according to claim 10, wherein a wavelength of the light emitted onto the prism is 400 to 700 nm.

* * * * *